US012671429B2

(12) United States Patent
Berens

(10) Patent No.: US 12,671,429 B2
(45) Date of Patent: Jun. 30, 2026

(54) SAR PIPELINE ANALOG-TO-DIGITAL CONVERTER (ADC) WITH FOREGROUND SELF-CALIBRATION

(71) Applicant: NXP USA, Inc., Austin, TX (US)

(72) Inventor: Michael Todd Berens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 55 days.

(21) Appl. No.: 18/903,425

(22) Filed: Oct. 1, 2024

(65) Prior Publication Data

US 2026/0095189 A1 Apr. 2, 2026

(51) Int. Cl.
H03M 1/10 (2006.01)
H03M 1/12 (2006.01)
H03M 1/46 (2006.01)

(52) U.S. Cl.
CPC ....... H03M 1/1009 (2013.01); H03M 1/1245 (2013.01); H03M 1/462 (2013.01)

(58) Field of Classification Search
CPC ... H03M 1/1009; H03M 1/1245; H03M 1/462
USPC ................................. 341/118, 120, 161, 163
See application file for complete search history.

(56) References Cited

U.S. PATENT DOCUMENTS 8,947,286 B2 * 2/2015 Chen ..................... H03M 1/145
341/172
10,128,862 B2 11/2018 Liu 10,243,577 B1 3/2019 Berens et al.
11,606,101 B2 * 3/2023 Moon ................... H03M 1/164
11,984,904 B2 5/2024 Berens
2021/0409035 A1 12/2021 Lindholm et al.

OTHER PUBLICATIONS

Alejandra Guzman, 16-bit SAR ADC calibration, NXP Community, Kinetis Microcontrollers Knowledge Base, Aug. 20, 2014.
Shuai Han et al., A 14-bit 500-MS/s Pipelined-SAR ADC in 28-nm CMOS with Foreground and Background Calibration, IEEE, The 7th International Conference on Integrated Circuits and Microsystems, Oct. 2022.
Zheyi Li et al., A CDAC Mismatch Calibration Technique for SAR-assisted Pipeline ADCs, 2023 21st IEEE Interregional NEWCAS Conference (NEWCAS), Edinburgh, United Kingdom, Jun. 2023, pp. 1-5, doi: 10.1109/NEWCAS57931.2023.10198141.

(Continued)

*Primary Examiner* — Khai M Nguyen

(57) ABSTRACT

A pipelined SAR ADC that is connected to receive an analog input voltage includes a first ADC stage, a residue amplifier, a second ADC stage, and calibration circuitry coupled and configured to add first and second ADC conversion results to form an uncalibrated digital value, and to apply calibration values to the uncalibrated digital value to obtain a calibrated digital value corresponding to a calibrated digital representation of the analog input voltage, where the calibration values include a first ADC stage DAC element mismatch calibration value corresponding to the first ADC conversion result, an offset calibration value, and a gain adjustment factor.

20 Claims, 11 Drawing Sheets

(56) References Cited

OTHER PUBLICATIONS

Yuxin Zhu et al., A Hybrid Calibration Technique for Bit-Weight Errors in Pipelined-SAR ADCs, 2023 5th International Conference on Circuits and Systems, 2023 5th International Conference on Circuits and Systems (ICCS), Huzhou, China, Oct. 2023, pp. 165-169, doi: 10.1109/ICCS59502.2023.10367374.

Jinpeng Zhou et al., All-Digital Background Calibration of a Pipelined-SAR ADC Using the "Split ADC" Architecture, 2023 IEEE International Symposium on Circuits and Systems (ISCAS), Monterey, CA, USA, May 2023, pp. 1-5, doi: 10.1109/ISCAS46773.2023. 10195888.

Jie Sun et al., Background Calibration of Bit Weights in Pipelined-SAR ADCs Using Paired Comparators, IEEE Transactions on Very Large Scale Integration (VLSI) Systems, vol. 28, No. 4, Apr. 2020.

Junjie Wu et al., Background Calibration of Capacitor Mismatch and Gain Error in Pipelined-SAR ADC Using Partially Split Structure, 2021 IEEE 5th Advanced Information Technology, Electronic and Automation Control Conference (IAEAC), Chongqing, China, Mar. 2021, pp. 1882-1885, doi: 10.1109/IAEAC50856.2021. 9390698.

Sourja Ray, Calibration of multi-bit per stage pipelined ADC using statistical properties of capacitor arrays, Electronic Theses and Dissertations, UC San Diego, 2008.

Antonio Gines et al., Digital Non-Linearity Calibration for ADCs With Redundancy Using a New LUT Approach, IEEE Transactions on Circuits and Systems—I: Regular Papers, vol. 68, No. 8, Aug. 2021.

Seung-Hoon Lee et al., Digital-Domain Calibration of Multistep Analog-to-Digital Converters, IEEE Journal of Solid-State Circuits, vol. 27, No. 12, Dec. 1992.

Ting Sun et al., Equivalent quantization correction technique for Pipelined SAR ADC, 2020 IEEE 15th International Conference on Solid-State & Integrated Circuit Technology (ICSICT), Kunming, China, Nov. 2020, pp. 1-3, doi: 10.1109/ICSICT49897.2020. 9278403.

Amr W. Hassan et al., Matrix-Based Digital Calibration Technique for High-Performance SAR and Pipeline ADCs, IEEE Transactions on Circuits and Systems—I: Regular Papers, vol. 71, No. 1, Jan. 2024.

Dong-Hwan Seo et al., A Self-Calibration of Capacitor Mismatch Error for Pipeline ADCs, Applied Sciences, Oct. 2023.

Cao Yuefeng et al: "A 91.0-dB SFDR Single-Coarse Dual-Fine Pipelined-SAR ADC With Split-Based Background Calibration in 28-nm CMOS", IEEE Transactions On Circuits and Systems I: Regular Papers, IEEE, US, vol. 68, No. 2, Feb. 2, 2021, pp. 641-654.

* cited by examiner

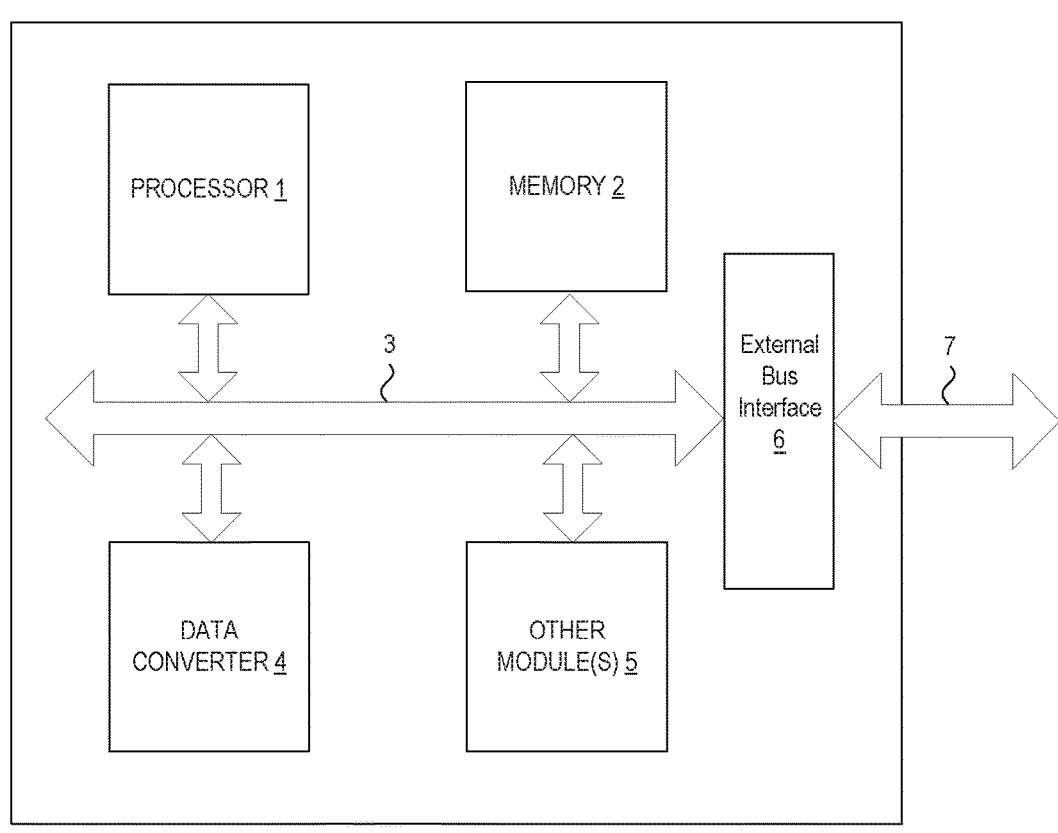
*Figure 1*

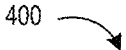
400
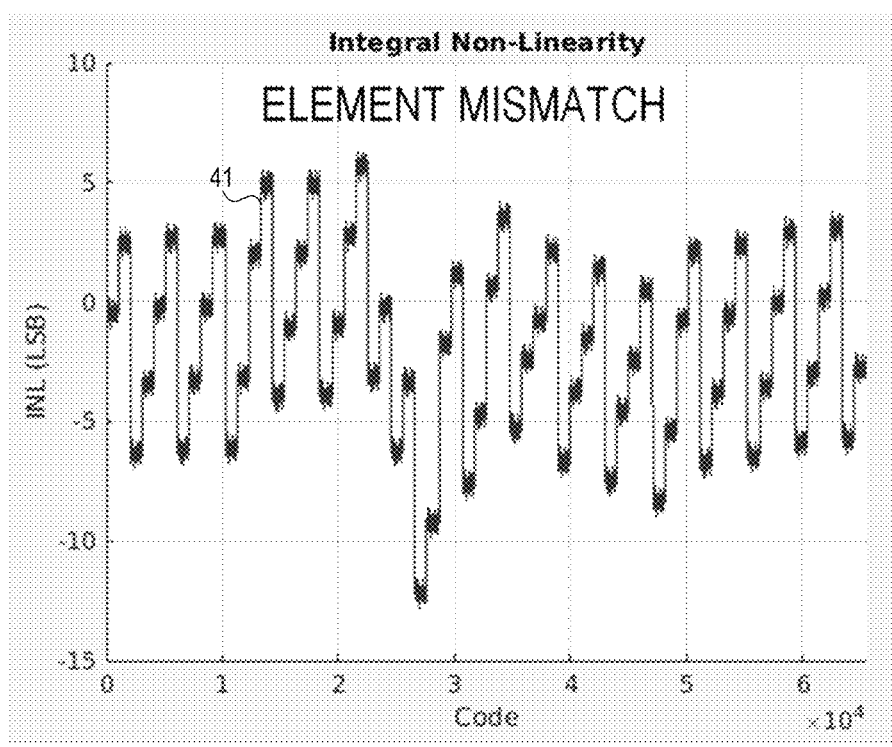
*Figure 4*

50
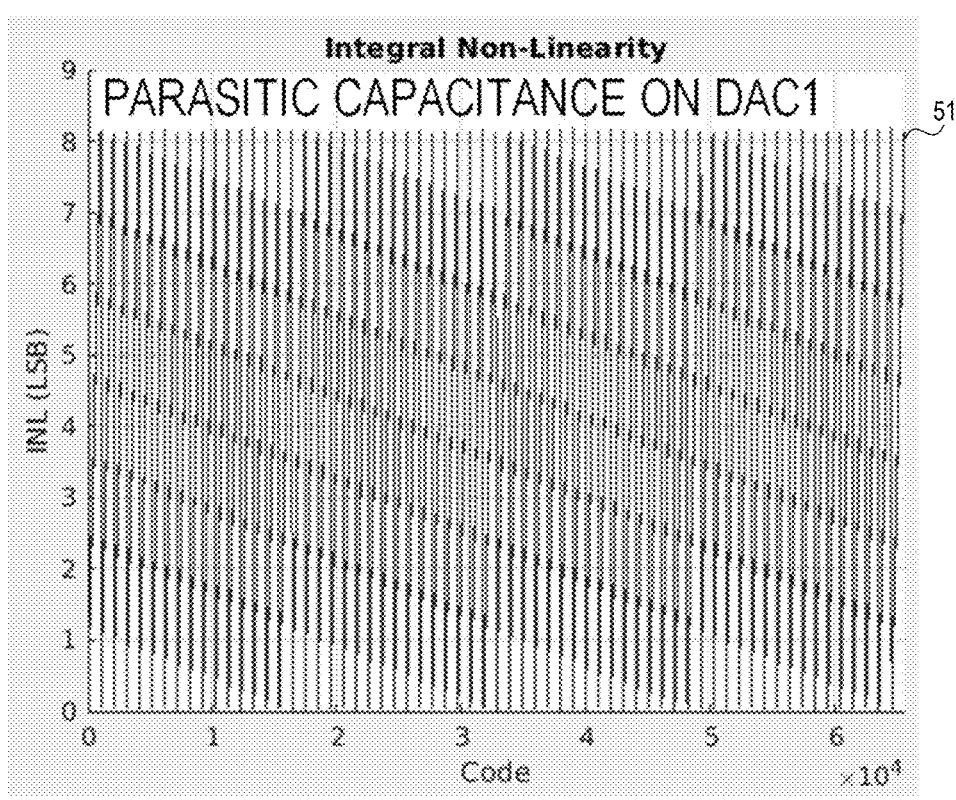
51
*Figure 5*

60
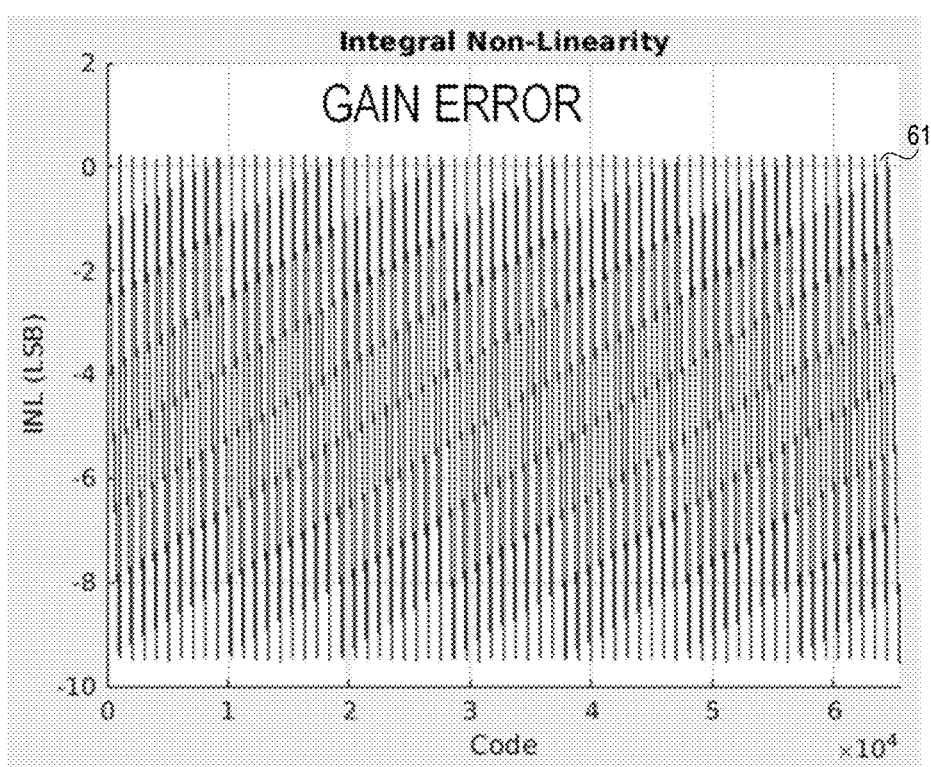
Figure 6

700
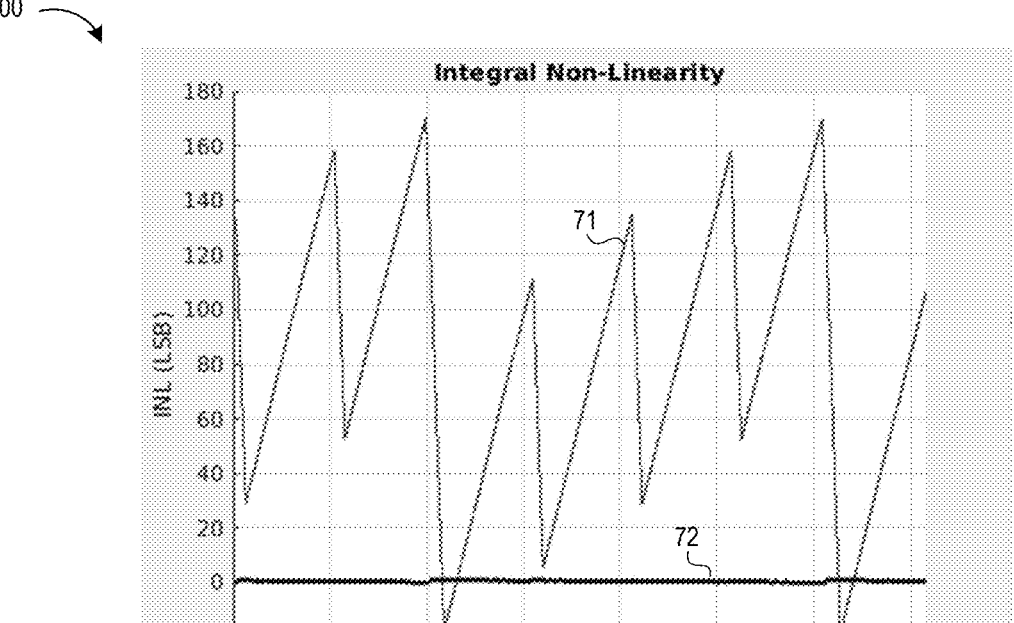
Figure 7
800
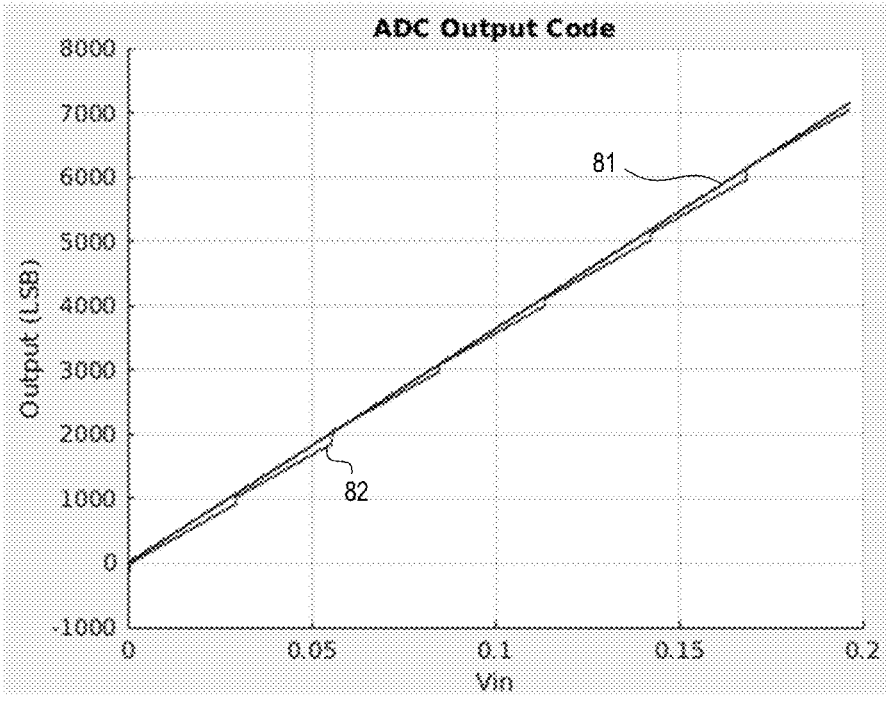
Figure 8

90

ADC
CONVERSION

START
91

SAMPLE INPUT VOLTAGE
ON ADC1 92

PERFORM SUCCESSIVE
APPROXIMATION ON ADC1 93

AMPLIFY RESIDUE VOLTAGE
(AND SAMPLE AMPLIFIED RESIDUE
ON ADC2) 94

RETRIEVE CALIBRATION
VALUE BASED ON ADC1
RESULT 95

PERFORM SUCCESSIVE
APPROXIMATION ON ADC2 96

CALCULATE FINAL RESULT FROM
ADC1 SAR RESULT, ADC2 SAR
RESULT, CALIBRATION VALUE,
RESIDUE AMPLIFIER OFFSET, AND
GAIN-ADJUSTMENT FACTOR 97

END
98

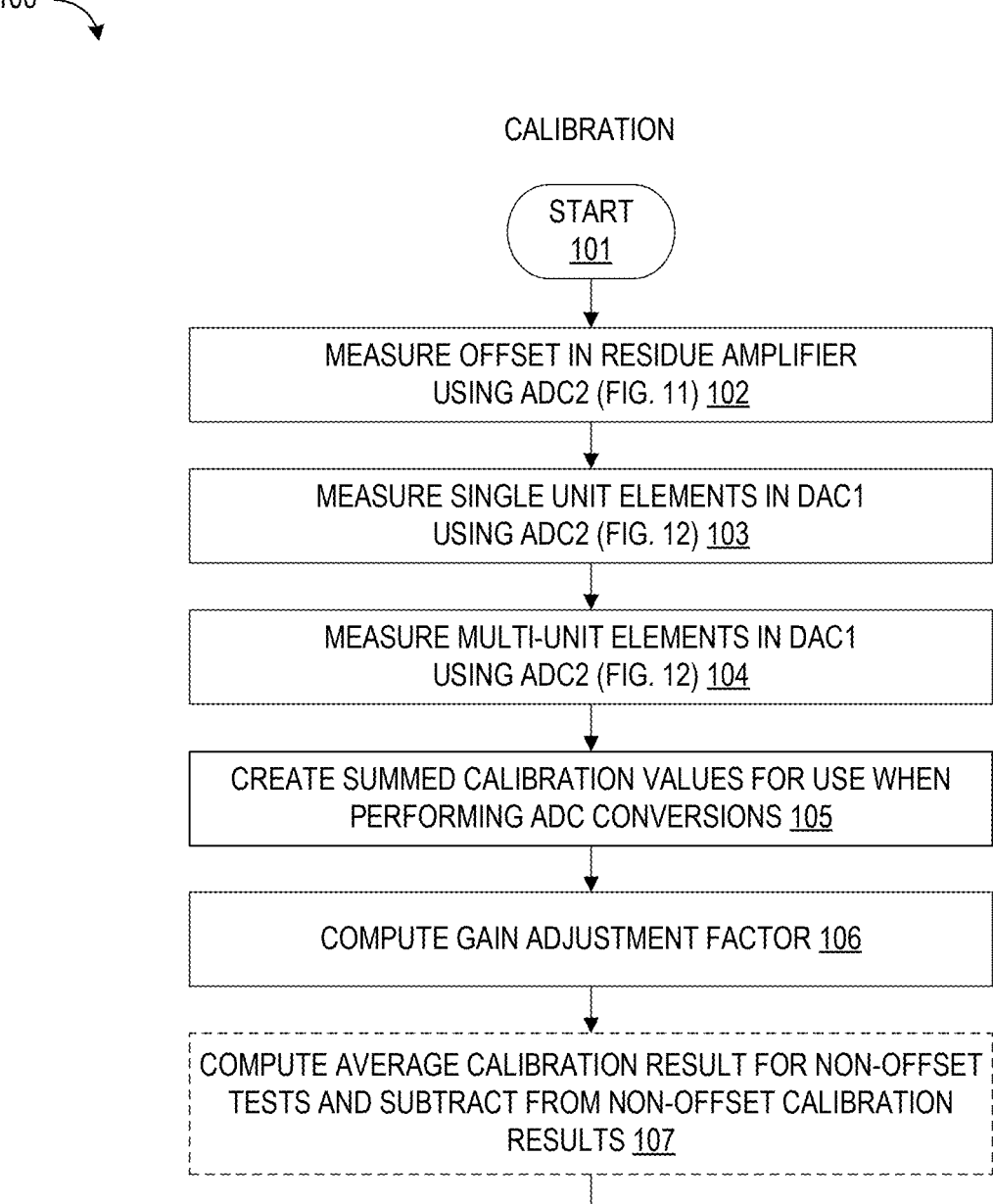

CALIBRATION

START
101

MEASURE OFFSET IN RESIDUE AMPLIFIER
USING ADC2 (FIG. 11) 102

MEASURE SINGLE UNIT ELEMENTS IN DAC1
USING ADC2 (FIG. 12) 103

MEASURE MULTI-UNIT ELEMENTS IN DAC1
USING ADC2 (FIG. 12) 104

CREATE SUMMED CALIBRATION VALUES FOR USE WHEN
PERFORMING ADC CONVERSIONS 105

COMPUTE GAIN ADJUSTMENT FACTOR 106

COMPUTE AVERAGE CALIBRATION RESULT FOR NON-OFFSET
TESTS AND SUBTRACT FROM NON-OFFSET CALIBRATION
RESULTS 107

END
108

*Figure 10*

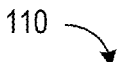
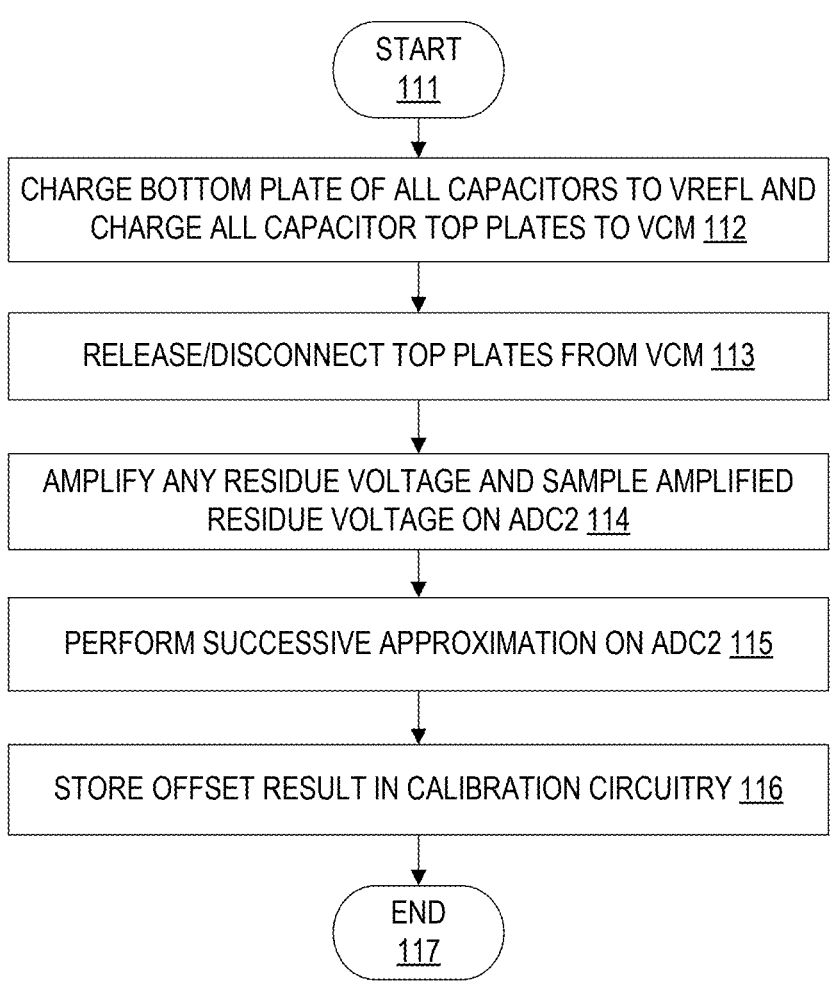
*Figure 11*

SAR PIPELINE ANALOG-TO-DIGITAL CONVERTER (ADC) WITH FOREGROUND SELF-CALIBRATION

BACKGROUND OF THE INVENTION

Field of the Invention

The present disclosure is directed in general to electrical circuitry for data conversion. In one aspect, the present disclosure relates generally to analog-to-digital converter (ADC) systems having calibration.

Description of the Related Art

In electronics, an analog-to-digital converter (ADC, A/D, or A-to-D) is a system that converts an analog input signal into a digital output signal. Successive approximation register (SAR) ADCs are a widely-employed type of analog-to-digital converter that offers low power, medium speed, moderate-to-high resolution, minimal active analog circuit, small die size, low latency and high reusability. In operation, an SAR ADC converts a continuous analog waveform into a discrete digital representation via a binary search. For example, a 12-bit SAR ADC converts an analog input voltage into a 12-bit binary representation. The SAR ADC operates using a binary search principle where the ADC makes a decision for each bit of resolution to converge to a digital output for each analog-to-digital conversion. A SAR ADC includes a digital-to-analog converter (DAC) and a comparator connected in a feedback loop with SAR logic. During an analog-to-digital conversion, the SAR ADC uses a sampling phase to sample an input voltage at the DAC, and during a comparison phase, the DAC binary-weighted elements are used to successively approximate the analog input voltage. At each successive approximation step, the comparator output is stored at output registers by the SAR logic as a digital word that provides the digital representation of the analog input voltage. A major limitation of SAR ADCs is the speed limitations that are caused by the serial nature of the binary search approach used with SAR ADCs. To improve the ADC sample rate, it is possible to pipeline lower resolution SAR ADCs to form a single high-speed ADC. In between SAR ADC stages, a gain element is used to amplify the residue voltage from the previous SAR stage for sampling into the subsequent SAR stage. This type of ADC is called a SAR-assisted pipeline, or pipelined SAR ADC.

As understood by those skilled in the art, there are a number of factors which comprise the accuracy of a high resolution SAR and pipelined SAR ADCs, such as device mismatch, mismatch of the scaling elements, parasitic elements, and noise. For example, a significant accuracy limitation of SAR-assisted pipeline ADCs is the DAC element mismatch in the front-end ADC (ADC1). These elements must match to the full resolution/accuracy of the combined ADC (front-end plus back-end). Another accuracy limitation arises from residue amplifier (RA) errors, such as feedback element mismatch, offset and finite gain. Parasitic capacitance in the front-end DAC (e.g., loading by the residue amplifier and comparator) can also cause errors similar to inaccurate RA gain. In addition, comparator offset in the back-end ADCs can cause errors.

With SAR-based ADCs having high resolution and accuracy, existing solutions for addressing accuracy limitations often require large and complex calibration circuitry that increases the area and power consumption of the ADC circuit. While background calibration schemes can address these issues, such solutions require a significant amount of computational time to converge to a calibration solution, and are not ideal for a general purpose MCU-based ADC circuits. As seen from the foregoing, the existing SAR-based ADC solutions for quickly and efficiently performing analog-to-digital conversions are extremely difficult at a practical level by virtue of the difficulty in balancing the design constraints for providing an efficient, low complexity, low power SAR-based ADC with the performance demands for performing high speed analog-to-digital conversion without significantly increasing the circuit area and power consumption or requiring long calibration convergence computations. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

FIG. 1 depicts a simplified block diagram of a microcontroller computer system in accordance with selected embodiments of the present disclosure.

FIG. 4 depicts a simulated waveform of an integral non-linearity signal from an uncalibrated pipelined SAR ADC.

FIG. 5 depicts an integral non-linearity transfer function of the parasitic capacitance on the front-end DAC outputs.

FIG. 6 depicts an integral non-linearity transfer function of the residue amplifier gain error.

FIG. 7 depicts a simulated waveform of an integral non-linearity signal of a pipelined SAR ADC in a conventional uncalibrated pipelined SAR ADC, along with an integral non-linearity signal of a pipelined SAR ADC which performs foreground self-calibration in accordance with selected embodiments of the present disclosure.

FIG. 8 depicts an ADC output code transfer function plot for uncalibrated and calibrated mismatch, gain error and parasitic capacitance.

FIG. 9 depicts a simplified flow chart showing the logic for performing a pipelined SAR conversion with calibration values obtained in accordance with selected embodiments of the present disclosure.

FIG. 10 depicts a simplified flow chart showing the logic for obtaining calibration values for all elements in a front-end ADC using the residue amplifier and one or more back-end ADCs in accordance with selected embodiments of the present disclosure.

FIG. 11 depicts a simplified flow chart showing the logic for measuring an offset value for the combination of residue amplifier and back-end ADC(s) using one or more back-end ADCs in accordance with selected embodiments of the present disclosure.

DETAILED DESCRIPTION

Figure 2:
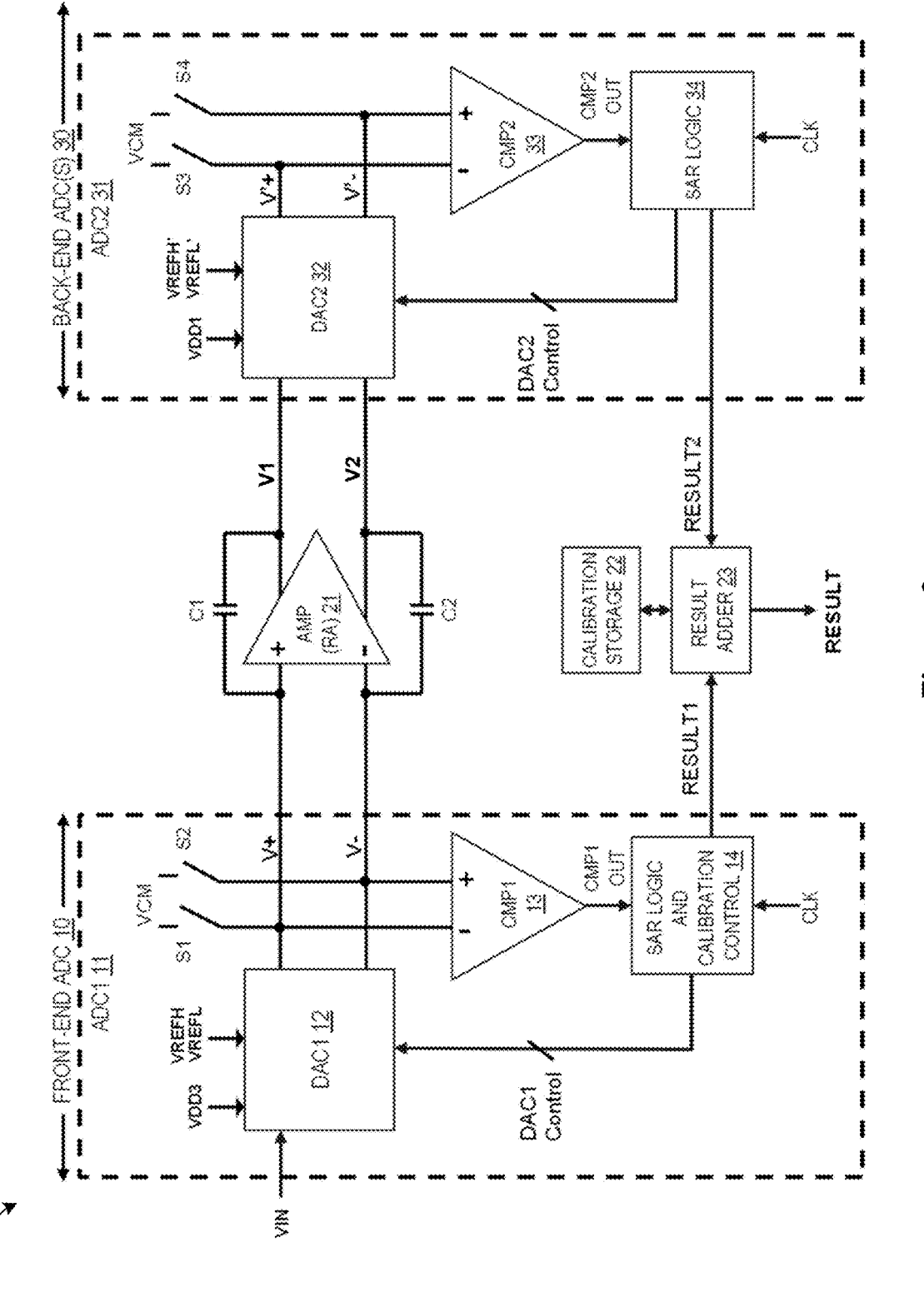
FIG. 2 depicts a schematic circuit block diagram of a pipelined SAR ADC in accordance with selected embodiments of the present disclosure.

A system, apparatus, and methodology are described for a pipelined successive approximation register (SAR) analog-to-digital converter (ADC) having a front-end ADC unit connected over a residue amplifier to one or more back-end ADC units, where the residue amplifier and one or more back-end ADC units are employed to perform foreground self-calibration processing to cancel element mismatch and parasitic effects in the front-end ADC unit and to remove effects from residue amplifier gain and offset errors and back-end ADC comparator offset. In selected embodiments, the disclosed foreground self-calibration processing methodology includes a first offset measurement step where the residue amplifier inputs are shorted to a common voltage and the amplified residue voltage is sampled on a back-end ADC unit to obtain a digital measure of the residue amplifier offset and the back-end ADC comparator offset. In addition, the disclosed foreground self-calibration processing methodology includes a calibration measurement step for each single unit DAC element in the front-end ADC unit, where a residue voltage is generated at each single unit DAC element and amplified by the residue amplifier for sampling on a back-end ADC unit to obtain a digital measure of the offset at each single unit DAC element in the front-end ADC unit. In addition, the disclosed foreground self-calibration processing methodology includes a calibration measurement step for each group of DAC elements in the front-end ADC unit that is larger than a single unit DAC element, where a residue voltage is generated from the group of DAC elements and amplified by the residue amplifier for sampling on a back-end ADC unit to obtain a digital measure of the offset at the group of DAC elements in the front-end ADC unit. In addition, the disclosed foreground self-calibration processing methodology includes one or more computation steps for summing the calibration values and creating a gain-adjustment factor which is applied to the pipelined SAR ADC conversion result after combining results from the front-end ADC unit and the back-end ADC unit(s). By running the foreground calibration method prior to initiating normal conversion operation of the pipelined SAR ADC, calibration correction values can be obtained for major static errors in the pipelined SAR ADC, such as mismatch errors from DAC elements, residue amplifier gain errors, parasitic capacitances, and amplifier and comparator offsets. In addition, the calibration correction values can be stored in a very small amount of memory and recalled after resets or power-down.

In connection with calibrating the single unit DAC element(s) and any multi-unit DAC element groups in the front-end ADC unit, the DAC element(s)/groups are switched around to create residue voltage outputs that provide element mismatch information within an appropriate range of residue voltages that would be seen in a normal conversion and not saturate the back-end ADC unit after amplification by the residue amplifier. In selected embodiments, this is accomplished by switching the single unit DAC element(s) and/or multi-unit DAC element groups to maintain a residue voltage output from the front-end ADC unit that is roughly in the range of −1 to +1 LSB of the front-end ADC unit. In an example 6-bit front-end ADC unit connected to a residue amplifier having a gain of G=32, the resulting residue voltage output would be +/−(Vrefh−Vrefl)/ 64. By creating a "close to zero" value (during the offset calibration of the residue amplifier and back-end comparator) and a "close to 1 LSB" value (during calibration of the single unit DAC element(s) and any multi-unit DAC element groups), both the offset and gain of the uncalibrated system can be obtained and then adjusted later during calibration. In particular, by creating "close to 1 LSB" values using each of the different elements of front-end ADC's DAC, the calibration values can be mathematically determined for use in correcting linearity errors in the front-end ADC. As will be appreciated, "close to zero" values can also be computed for each element in front-end DAC, but this is not necessary because it doesn't provide any new information.

Reference is now made to FIG. 1 which depicts a simplified block diagram of a microcontroller computer system 100 in accordance with selected embodiments of the present disclosure. As depicted, the microcontroller computer system 100 includes one or more processors 1 and a memory 2 connected over a bi-directional bus 3 to a data converter 4, one or more other modules 5, and external bus interface 6. As will be appreciated, the microcontroller computer system 100 can receive inputs and provide outputs by way of a bus 7 or a plurality of electrical signals 7 coupled to external bus interface 6. In other embodiments, the microcontroller computer system 100 may include fewer, more, or different blocks of circuitry than those illustrated in FIG. 1. As disclosed herein, the microcontroller computer system 100 may be implemented with a single integrated circuit, with a plurality of integrated circuits, or as a combination of integrated circuits and discrete components.

To provide a contextual understanding for the present disclosure, reference is now made to FIG. 2 which depicts a schematic block diagram of a pipelined SAR ADC 200 which includes a front-end ADC unit 10 connected over a residue amplifier 21 to one or more back-end ADC units 30. In operation, the pipelined SAR ADC 200 is configured to convert an analog signal VIN to digital output RESULT bits in multiple pipelined ADC stages connected in series where an output of one ADC stage (e.g., 10) is fed to an input of the next ADC stage (e.g., 30) with processing by the individual ADC stages being performed simultaneously in a time sliced fashion. There are at least two ADC stages connected in the pipelined SAR ADC 20, including a front-end ADC 10 and one or more back-end ADCs 30. In this way, multiple low-resolution ADC stages may be cascaded to obtain a high-resolution output, where each ADC stage performs an analog-to-digital conversion on an analog input signal by sampling the analog input signal and converting the sampled analog input signal to a pre-configured number of digital bits (e.g., 2 bits, 3 bits, 4 bits, or any number of bits). In addition, each ADC stage, except the last ADC stage, generates a residue signal which is fed to a succeeding ADC stage and converted to digital bits by the succeeding ADC stage. In selected embodiments, each ADC stage may be a successive approximation register (SAR) ADC, a flash-based ADC, or any other type of ADC. As depicted, the pipelined SAR ADC 200 includes a residue amplifier (RA) 21 that is coupled between the front-end ADC stage 10 and the back-end ADC stage 30 for amplifying the residue signal output from the front-end ADC stage 10 in the pipeline and feeding the amplified residue signal to the back-end ADC stage 30 in the pipeline. In selected embodiments, the residue amplifier 21 may be embodied as a differential amplifier which has output voltages V1, V2 connected in feedback over feedback capacitors C1, C2 to the non-inverting and inverting inputs, respectively of the residue amplifier 21. As will be appreciated, the feedback capacitors C1, C2 may nominally have the same value, with the ratio of $C_{DAC}$ (the total capacitance of all elements and the termination capacitor in the front-end DAC1) to C1 determining the closed-loop gain of the residue amplifier 21. In addition, the pipelined SAR ADC 200 includes result adder unit 23 which is connected to synchronize digital outputs generated by the pipelined ADC stages 10, 30 for combination as the ADC output RESULT.

The disclosed front-end ADC1 10 includes a first digital-to-analog converter (DAC1) 12 and a first comparator (CMP1) 13 connected in a feedback loop with a digital SAR logic and calibration control block 14 which executes a binary search algorithm to provide an n-bit DAC1 feedback control signal to the first DAC1 12. As will be appreciated, the first DAC1 12 may include one or more sampling arrays of binary weighted elements (e.g., a plurality of capacitive sampling circuits) which are connected to receive a voltage input signal VIN, a supply voltage (e.g., VDD3), a high reference voltage VREFH and a low reference voltage VREFL using the connection switches that are controlled by the n-bit DAC1 feedback control signal generated by the SAR logic and calibration control block 14. Other embodiments may use any type of charge redistribution array for data conversion. In addition, alternate embodiments may use any desired and appropriate binary weighted elements (e.g., resistive elements, capacitive elements, a combination thereof, etc.). The depicted first comparator (CMP1) 13 includes a first inverting input terminal that receives a first-differential-input-signal (V+), which in this example is a positive-differential-input-signal. The first comparator (CMP1) 13 also includes a second non-inverting input terminal that receives a second-differential-input-signal (V−), which in this example is a negative-differential-input-signal. The first comparator (CMP1) 13 has a comparator-output-terminal CMP1OUT that is connected to an input of the digital SAR logic and calibration control block 14. With an asynchronous SAR ADC, the CLK signal only dictates the ADC's sample and approximation phases, and the bit/step timing is controlled by self-timed circuits inside the digital SAR logic and calibration control block 14. However, with a synchronous SAR ADC, the digital SAR logic and calibration control block 14 stores the comparator output CMP1OUT in a SAR register (not shown) in response to the CLK latch at each step of the approximation. The digital SAR logic and calibration control block 14 also processes the comparator output signal CMP1OUT in order to generate the DAC1 feedback control signal that provides DAC control values that are representative of an n-bit digital word for supplying as a control to the first DAC1 12. The digital SAR logic and calibration control block 14 also generates an output signal (RESULT1) that provides a digital representation of the input voltage signal VIN at the input of the front-end ADC1 10.

In a similar way, the disclosed back-end ADC 30 includes a second DAC2 31 and a second comparator (CMP2) 33 connected in a feedback loop with a digital SAR logic block 34 which executes a binary search algorithm to provide an n-bit DAC2 feedback control signal to the second DAC2 32. Again, the second DAC2 32 may include one or more sampling arrays of binary weighted elements which are connected to receive the differential input voltage signals from the residue amplifier 21, a supply voltage (e.g., VDD1), a high reference voltage VREFH' and a low reference voltage VREFL' using connection switches that are controlled by the n-bit DAC2 feedback control signal generated by the SAR logic block 34. With the depicted second comparator (CMP2) 33 connected to receive a first-differential-input-signal (V'+) at a first inverting input terminal and to receive a second-differential-input-signal (V'−) at a second non-inverting input terminal, the second comparator (CMP2) 33 generates a comparator output signal CMP2OUT at a comparator-output-terminal CMP2OUT that is provided to an input of the digital SAR logic block 34. At each step of the approximation, the digital SAR logic block 34 stores the comparator output CMP2OUT in SAR register (not shown). The digital SAR logic block 34 also processes the comparator output signal CMP2OUT in order to generate the DAC2 feedback control signal that provides DAC control values that are representative of an n-bit digital word for supplying as a control to the first DAC1 32. The digital SAR logic block 34 also generates an output signal (RESULT2) that provides a digital representation of the amplified differential input voltage signal V1, V2 generated by the residue amplifier 21 from the residue (V+, V−) of the front-end ADC 10. In the depicted digital SAR logic block 34, there is no calibration control circuitry included because mismatch in the back-end ADC 30 is relatively small compared to other errors due to the inter-stage gain. However, it will be appreciated that the digital SAR logic block 34 may also include calibration control circuitry.

As understood by those skilled in the art, SAR-assisted pipeline ADCs are popular because they take advantage of the power-efficiency of SAR ADCs, but provide higher bandwidth and significantly relax the comparator noise requirements that limit most high-resolution SAR ADCs. However, there are significant accuracy limitations with SAR-assisted pipeline ADCs, including DAC element mismatch in the front-end ADC (ADC1). In addition, accuracy limitations arise from errors in the residue amplifier 21, like feedback element mismatch, offset and finite gain. In addition, parasitic capacitance in the front-end DAC1 12 (e.g. loading by the residue amplifier and comparator) also causes errors. And errors can also be caused by comparator offset in the back-end ADCs. When targeting high resolution and accuracy, these errors must be addressed while minimizing the area and power consumption for the ADC.

Without calibration in pipelined SAR ADCs, the matching of MSB elements in the front-end DAC limits the overall resolution to about 10-12 bits. Also, like pipelined ADCs, the accuracy of interstage gain is important. To address these error sources and others known to those skilled in the art, the disclosed SAR ADC 200 includes a calibration storage unit 22 which stores calibration values generated with a foreground self-calibration method to address mismatch in the front-end DAC elements, residue amplifier gain error, parasitic capacitances on front-end DAC outputs, and offsets of amplifier and comparators, thereby allowing high ADC linearity with digital-only post-correction of ADC results.

Figure 3:
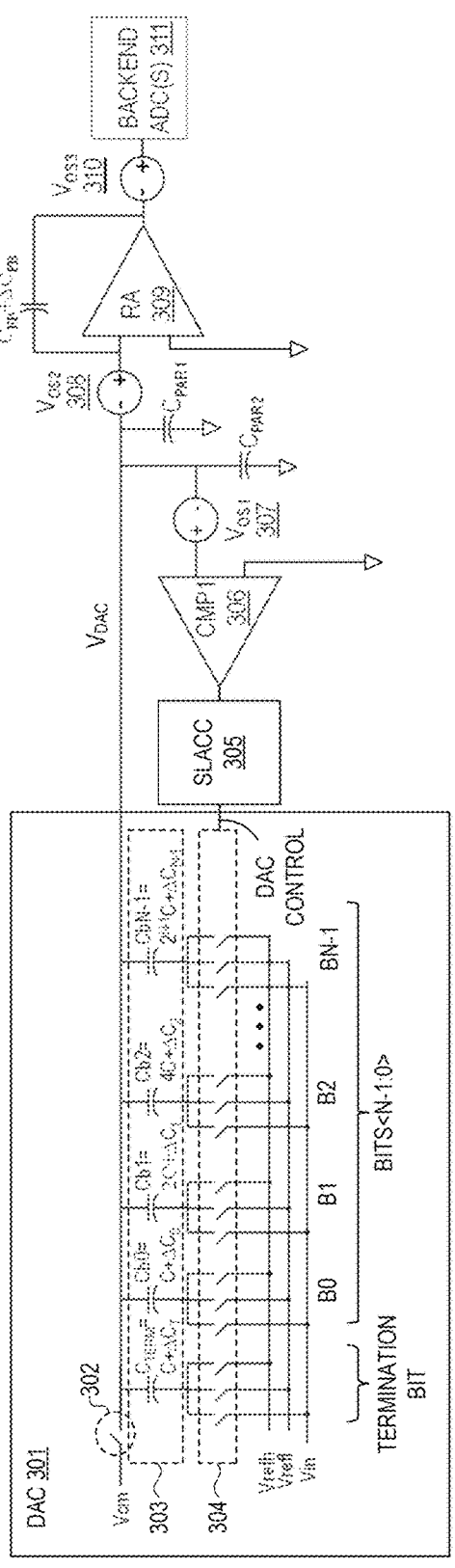
FIG. 3 depicts a simplified circuit schematic of a pipelined SAR ADC connected and configured to perform foreground calibration in accordance with selected embodiments of the present disclosure.

To provide additional details for an improved understanding of selected embodiments of the present disclosure, reference is now made to FIG. 3 which depicts a simplified circuit schematic of a pipelined SAR ADC 300 connected and configured to perform foreground calibration. As depicted, the pipelined SAR ADC 300 includes a first ADC stage 301-306 coupled over a residue amplifier (RA) 309 to a back-end ADC 311 of a second ADC stage. In particular, the first ADC stage 301-306 includes an N-bit DAC 301 connected to generate an output voltage VDAC, a first comparator CMP1 306, and a SAR logic and calibration control (SLACC) block 305 which is connected to provide DAC control signals to the switch array 304 of the N-bit DAC 301 which are connected between the capacitors 303 and the DAC input voltages Vrefh, Vrefl, Vin. In response to the DAC control signals being supplied by the SLACC block 305 to the switch array 304 to connect the voltage terminals Vrefh, Vrefl, and Vin to the bottom plates of the switched capacitors 303, the N-bit DAC 301 provides an output voltage (VDAC) to a first input of the comparator 306. The second input of the comparator 306 may be connected to receive a reference voltage (Vref) or a differential output voltage, depending on the application. For simplicity, the comparator 306 is shown as a single-ended comparator, but it will be appreciated that a differential comparator can also be used. The first input of comparator 306 is also coupled to a common mode voltage (Vcm) via a switch 302. An output of comparator 306 is provided to the SLACC 305, which includes storage circuitry to store a SAR result.

In the illustrated embodiment, the DAC 301 is an N-bit capacitor DAC which represents N bits with N binary weighted capacitors. The N bits of the DAC 301 are shown as Bit(0)-Bit(N–1), and include L least significant bits (LSBs) and M most significant bits (MSBs) such that N=L+M. The depicted DAC 301 includes an array of capacitors 303, including a first termination capacitor $C_{TERM}$ and a plurality of N additional capacitors corresponding to Bit(0)-Bit(N–1). Ideally, the first termination capacitor $C_{TERM}$ has a unit capacitance value of C, and the plurality of N additional bit capacitors corresponding to Bit(0)-Bit(N–1), each having a binary weighted capacitance, starting with a first bit capacitor Cb0 having a capacitance C, a second bit capacitor Cb1 having a capacitance 2C, and continuing until the $N^{th}$ bit capacitor CbN–1 having a capacitance $2^{(N-1)}C$. Though not shown, it will be appreciated that the DAC 301 may include any suitable arrangement of switching capacitors. For example, the capacitor array 303 may include one or more scaling capacitors connected between the L bit capacitors of the LSBs and the M bit capacitors of the MSBs. In addition or in the alternative, the capacitor array 303 may include one or more redundant bits (also referred to as redundant DAC elements or redundant elements) which are represented by capacitors. In addition or in the alternative, the capacitor array 303 may include non-binary scaled capacitors, for example radix<2, for redundancy. Each top plate of the array of capacitors 303 is connected over a switch 302 to be driven to a common mode voltage Vcm during the sample phase while the analog input signal Vin is applied to the capacitor bottom plates using the switch array 304. In addition to receiving the analog input signal Vin, the switch array 304 receives the high voltage reference Vrefh and the low voltage reference Vrefl (or ground), and each of these signals are coupled to a selected number of binary-weighted capacitors 303 in response to the DAC control signal. In particular, each circuit in the switch array 304 that is connected to a binary-weighted capacitor 303 can be individually and selectively manipulated to select any of these three signals in response to DAC control signal.

Each capacitor in the switched capacitor array 303 has a first terminal (i.e. top plate) coupled to the output voltage (VDAC). In addition, a second terminal (i.e. bottom plate) of each capacitor in the switched capacitor array 303 is coupled to the switch array 304 which controls the voltage applied at the bottom plates of the switched capacitor array 303. The switched capacitor array 303 is controlled by the DAC control signal to apply Vin, Vrefh, and Vrefl, as needed, based on the current operation, e.g. sample or comparison phases of a conversion or calibration operation. To this end, each switching circuit in the switch array 304 includes three switches to respectively couple the bottom capacitor plate to Vrefl, Vrefh, and the input voltage Vin. During the sample phase, the switching circuits in the switch array 304 may be set to a conductive mode to apply Vin to the bottom plate(s) of the switched capacitor array 303, and during the approximation phase, the switching circuits in the switch array 304 may be set to a conductive mode to apply Vrefl or Vrefh to the bottom plate(s) of the switched capacitor array 303. depending on whether the particular bit is required to represent the input voltage. The switch settings to apply a selected voltage to the corresponding bottom plate can be provided to the switch array 304 by way of the DAC control signal.

While selected embodiments of the DAC 301 are described with reference to a capacitor array 303 wherein each of the LSBs and the MSBs are represented by binary weighted capacitors (i.e. binary encoded capacitors), it will be appreciated that different encodings may be used. For example, the LSBs may be represented by L binary encoded capacitors, and the M MSBs may be represented by ther- mometer (a.k.a., unary) encoded bits or a combination of one or more binary encoded bits and one or more unary/ thermometer encoded bits. Also, depending on the encod- ings used for the DAC capacitors, each of the N bits can be represented by one or more capacitors.

As will be appreciated by those skilled in the art, there are a number of non-idealities that contribute to mismatch errors which can negatively impact accuracy of the pipelined SAR ADC 300. For example, FIG. 3 shows that, in the front end DAC 301, each bit capacitor in the array of capacitors 303 includes a potential capacitance mismatch $\Delta C_i$. As a result, the total capacitance of the first termination capacitor $C_{TERM}=C+\Delta C_{TERM}$, where $\Delta C_{TERM}$ is the potential capaci- tance mismatch for the first termination capacitor. Similarly, the total capacitance of the first bit capacitor $Cb0=C+\Delta C_0$, where $\Delta C_0$ is the potential capacitance mismatch for the first bit capacitor. Likewise, the total capacitance of the second bit capacitor $Cb1=2C+\Delta C_1$, where $\Delta C_1$ is the potential capacitance mismatch for the second bit capacitor, and so on so that the total capacitance of the Nth bit capacitor CbN– $1=2^{(N-1)}C+\Delta C_{N-1}$, where $\Delta C_{N-1}$ is the potential capacitance mismatch for the Nth bit capacitor. In addition to mismatch in the front-end DAC elements, the pipelined SAR ADC 300 may also have residue amplifier gain error, which may be represented with the feedback capacitance mismatch ($\Delta C_{FB}$) at the feedback capacitor ($C_{FB}$) of the residue amplifier 309. In addition, the pipelined SAR ADC 300 may have errors caused by the parasitic capacitance at the residue amplifier ($C_{PAR1}$) and the comparator ($C_{PAR2}$) on the front-end DAC outputs. The pipelined SAR ADC 300 may also have errors caused by the offset voltages at the comparator 306 ($V_{OS1}$) and residue amplifier 309 ($V_{OS2}$, $V_{OS3}$). Due to the inter- stage gain at the residue amplifier 309, the mismatch in back-end ADCs 311 is relatively small compared to other errors, and is therefore not depicted in FIG. 3.

To illustrate the linearity impact from capacitive mis- matches ($\Delta C_i$) in the front-end DAC elements without other error contributions, reference is now made to FIG. 4 which depicts a simulated waveform 400 of an integral non- linearity (INL) signal 41 from an uncalibrated pipelined SAR ADC. As shown with the simulated waveform 41, the linearity measure is degraded by the presence of capacitive mismatches ($\Delta C_i$) in the front-end DAC, ranging from INL measures between –12 and 6 INL over the simulated code range. Thus, the performance of a conventional pipelined SAR ADC with capacitive mismatch in the front-end DAC departs significantly from the ideal INL=0 value.

As will be appreciated by those skilled in the art, the presence of parasitic capacitance in the pipelined SAR ADC can significantly impact device performance. To illustrate the linearity impact from parasitic capacitance ($C_{PAR}$) in the pipelined SAR ADC, reference is now made to FIG. 5 which depicts a simulated waveform 500 of an integral non-linearity signal 51 of an LSB ADC stage having a parasitic capacitance at the input to the residue amplifier. As shown with the simulated waveform 51, the linearity measure is significantly degraded by the presence of parasitic capacitance $C_{PAR}$ in the front-end DAC, ranging up to 8 INL from the parasitic capacitance over the simulated code range. Thus, the performance of a conventional pipelined SAR ADC with even a relatively small parasitic capacitance can dominate the error sources in terms of significantly departing from the ideal INL=0 value.

It will also be appreciated by those skilled in the art that the presence of residue amplifier gain error in the pipelined SAR ADC can significantly impact device performance. To illustrate the linearity impact from residue amplifier gain error in the pipelined SAR ADC, reference is now made to FIG. 6 which depicts a simulated waveform 600 of an integral non-linearity signal 61 of a pipelined SAR ADC having a residue amplifier gain error. As shown with the simulated waveform 61, the linearity measure is significantly degraded by the presence of residue amplifier gain errors from feedback capacitor mismatch and/or finite open-loop gain, ranging up to −9.5 INL from the gain error over the simulated code range. Thus, the performance of a conventional pipelined SAR ADC with residue amplifier gain error can also contribute an error source in terms of significantly departing from the ideal INL=0 value.

To address the effects of such errors, there is disclosed herein a system, apparatus, and methodology a pipelined SAR ADC in which a foreground self-calibration processing methodology and circuit is provided to selectively determine a voltage offset for the residue amplifier, and then measure different weight of groups of capacitors relative to an ideal LSB size as seen by the back-end ADCs using the gained-up voltage from the residue amplifier. To avoid saturating the back-end ADCs, the residue of each test is limited to ~1 LSB of the front-end ADC. To this end, larger groups of capacitors are offset with smaller groups of capacitors. Subsequently, the results of the calibration tests are mathematically combined and selectively used to digitally correct ADC results depending on the front-end ADC code result.

To illustrate the linearity impact from removing the effects of capacitive mismatches in the front-end DAC elements by employing the foreground self-calibration techniques disclosed herein, reference is now made to FIG. 7 which depicts a simulated waveform 700 of an integral non-linearity signal 71 of a pipelined SAR ADC in a conventional uncalibrated pipelined SAR ADC, along with an integral non-linearity signal 72 of a pipelined SAR ADC which performs foreground self-calibration in accordance with selected embodiments of the present disclosure. As shown with the simulated waveform 71, the linearity measure is degraded by the presence of capacitive mismatches ($\Delta C_i$) and parasitic capacitance ($C_{PAR}$) in the front-end DAC, together with gain errors in the residue amplifier, ranging from INL measures between −20 and 170 INL over the simulated code range. In addition, the simulated waveform 72 shows that the linearity measure of the performance of a pipelined SAR ADC that tracks quite closely to the ideal INL=0 value after using foreground self-calibration to remove the mismatch contributions.

To provide additional details for an improved understanding of selected embodiments of the present disclosure, reference is now made to FIG. 9 which depicts a simplified flow chart 90 showing the logic for performing ADC conversion with calibration values with a pipelined SAR ADC. In an example embodiment, the processing shown in FIG. 9 may be performed with one or more SAR engine blocks embodied with dedicated hardware, software, or hybrid implementations and configured for controlling the front-end and back-end ADC stages to generate uncalibrated SAR ADC results from the front-end and back-end ADC stages, to compute a difference sum by subtracting, from the uncalibrated SAR ADC results, pre-calculated offset and linearity calibration values based on the SAR ADC results from the front-end ADC stage, and to apply a gain adjustment factor to the computed difference sum to obtain a calibrated SAR ADC result.

After the method starts at step 91, the ADC conversion methodology 90 uses control logic and/or hardware at the SAR engine to initiate a sampling phase of an analog input voltage on the bottom plates of a front-end ADC stage (step 92). With reference to the pipelined SAR ADC 200 shown in FIG. 2, an example may be illustrated with reference to a 6-bit ADC1 11 and 6-bit ADC2 31 connected with one bit overlap (for redundancy) which creates an 11-bit ADC overall. In this example, the gain G of the residue amplifier 21 is G=32, so the residue amplifier 21 receives the input residue voltage (Vres=V+−V−) and amplifies it to an amplified voltage of G*Vres=32*(V+−V−) which is sampled and converted by the back-end 6-bit ADC2 31. At step 92, the SAR logic block 14 may be used to generate sampling DAC control feedback signals which initiate the sampling phase at the 6-bit DAC 12 by connecting the analog input voltage Vin to the bottom capacitor plates while the common mode voltage Vem is connected to the top capacitor plates by switches S1, S2. Note that Vrefh is greater than Vrefl, and setting the bottom plate of a capacitor to Vrefh may be referred to as turning ON or adding a capacitor and setting the bottom plate to Vrefl may be referred to as turning OFF or removing the capacitor. At step 92, the sampling phase is ended by releasing or disconnecting the top capacitor plates from the common voltage (Vcm), thereby sampling the input voltage Vin by storing a proportional charge in the DAC 12 of the front-end ADC stage 11.

Following the analog input voltage sampling step 92, the front-end ADC stage performs a successive approximation conversion step at step 93. With reference to the example shown in FIG. 2, the SAR logic block 14 in the front-end ADC1 11 may be configured to generate conversion DAC1 control feedback signals to the DAC1 12 so that each result bit value is determined, in turn, by comparator 13 and SAR logic block 14. Note that the conversion phase may also be referred to as the approximation phase. For example, the conversion (or approximation) phase begins with setting the bottom plate of the largest MSB capacitor to Vrefh. The appropriate control signals to do so may be provided as part of DAC1 Control from the SAR logic and calibration control block 14. The resulting comparison output from the comparator 13 may be stored and used to update the DAC1 Control for the next MSB capacitors which are sequentially processed in a similar fashion to determine all N digital output bits of the output signal ADC1 SAR result (RESULT1) generated by the front-end ADC1. Once all bits have been determined, the differential voltage remaining on the DAC1 output, V+−V−, is the residue voltage (Vres) to be amplified by the residue amplifier. Continuing with the example illustration shown in FIG. 2 where the front-end stage includes a 6-bit DAC1 12, the result of performing SAR conversion at step 93 on an analog input voltage Vin at the front-end ADC stage 11 may generate an ADC1 result=010111 (binary)=23 (decimal). The residue voltage in this example will be Vres=Vin−23*(Vrefh−Vrefl)/64.

At step 94, the residue voltage signal generated by the front-end ADC stage is amplifed for sampling by the back-end ADC stage. With reference to the example shown in FIG. 2, the residue amplifier 21 may be used to amplify the residue voltage Vres generated by the front-end ADC1 11 across the V+ and V− terminals. In other words, the residue amplifier 21 receives the residue voltage (e.g., Vres=(V+−V−)) at the amplifier inputs, and generates an amplified residue voltage (e.g., G*Vres), where G is the gain of the residue amplifier 21. As part of step 94, the back-end ADC stage samples the amplified residue voltage. With reference to the example shown in FIG. 2, the back-end ADC2 31 may sample the amplified residue voltage G*Vres at the DAC 32 in response to the DAC2 Control signal from the SAR logic block 34. Due to the pipelined nature of the ADC, after step 94, the front-end ADC1 is available to start a new conversion. This begins with sampling a new input voltage (step 92) and then performing a new successive approximation (step 93) while the back-end ADC2 is performing its successive approximation (step 96). When both steps 93 and 96 are complete, the residue amplifier will amplify the new residue voltage into ADC2 (step 94).

At step 95, a calibration value is retrieved from memory based on the successive approximation conversion result generated by the front-end ADC stage at step 93. Continuing with the example illustration shown in FIG. 2, the result adder 23 may be configured to retrieve a calibration value (e.g., calval(ADC1_result)) from calibration storage 22 which corresponds to the ADC1 result (e.g., calval(23)). As described more fully herein below, the calibration values may be calculated as calval(R) for each ADC result value R that is generated by the front-end ADC stage. While the depicted retrieval step 95 may be performed in parallel with the residue voltage amplification step 94, it may also be performed before or after the residue voltage amplification step 94.

After the amplified residue voltage is sampled by the back-end ADC stage, the back-end ADC stage performs a successive approximation conversion phase at step 96. With reference to the example shown in FIG. 2, the SAR logic block 34 in the back-end ADC2 31 may be configured to generate conversion DAC2 control feedback signals to the DAC2 32 so that each result bit value is determined, in turn, by comparator 33 and SAR logic block 34. The resulting comparison output from the comparator 33 may be stored and used to update the DAC2 Control for the next MSB capacitors which are sequentially processed in a similar fashion to determine all N digital output bits of the output signal ADC2 SAR result (RESULT2) generated by the back-end ADC2. Continuing with the example illustration shown in FIG. 2 where the back-end stage includes a 6-bit DAC2 32, the result of performing SAR conversion at step 96 on the amplified residue voltage G*Vres at the back-end ADC stage 31 may generate an ADC2 result=101101 (binary)=45 (decimal).

At step 97, the ADC conversion methodology calculates a final result from the ADC1 SAR result (obtained at step 93), the ADC2 SAR result (obtained at step 96), the retrieved calibration value (obtained at step 95), the offset value, and any gain-adjustment factor that is computed as described herein. In particular, the final result value calculated at step 97 may be computed by multiplying a gain adjustment value (gain_adjust) with a calibrated SAR ADC result that is computed by adding the ADC1 SAR result and ADC2 SAR result together with proper alignment for redundancy to obtain the uncalibrated result (raw_result), subtracting the retrieved calibration value which corresponds to the ADC1 SAR result (e.g., calval(ADC1_result)), and subtracting the offset value (ResOS). Stated equationally, the final result is RESULT=gain_adjust*(raw_result−calval(ADC1_result)−ResOS).

With reference to the example shown in FIG. 2 where the front-end stage 11 includes a 6-bit DAC1 12, the gain of the residue amplifier 21 is G=32, and the back-end stage 31 includes a 6-bit DAC2 32, the result adder 23 may be configured to retrieve the calibration value calval (ADC1_result) from the calibration storage unit 22, along with the ADC1 SAR result (RESULT1) and the ADC2 SAR result (RESULT2). In this example, the 6-bit ADC1 and 6-bit ADC2 have a one bit overlap (for redundancy) to create an 11-bit ADC overall. After the ADC conversion is performed (ADC1 conversion step 93, residue voltage amplification step 94, and then ADC2 conversion step 96), the final ADC result is computed at step 97 by adding the ADC1 and ADC2 results together (with proper alignment for redundancy). For example, if the ADC1 conversion result=23 and ADC2 conversion result=45 and there is 1-bit overlap for redundancy, then the uncalibrated result is obtained by adding them together:

$$010111xxxxx$$
$$+xxxxx101101$$
$$= 01100001101$$

The resulting sum for the uncalibrated result is represented as:

$$\text{raw\_result} = \text{result}(ADC1)*32 + \text{result}(ADC2) = 736 + 45 = 781.$$

While any redundant bit values can be added to uncalibrated result, they are ignored for purposes of simplifying this example.

The next step in the calculation of the final result is to adjust the uncalibrated result by subtracting the calibration value corresponding to the ADC1 conversion result (calval (ADC1_result)) from the uncalibrated result. In the described example, the value calval(23) would be subtracted from the uncalibrated result. In addition, the offset value (ResOS) for the residue amplifier 21 is retrieved from calibration storage 22 and subtracted from the uncalibrated result. The resulting calibrated SAR ADC result (raw_result−calval(ADC1_result)−ResOS)) is then multiplied by a gain adjustment factor (gain_adjust) to compute the final result:

$$\text{RESULT} = \text{gain\_adjust}*(\text{raw\_result} - calval(\text{ADC1\_result}) - ResOS).$$

Or, equivalently, the final result calculated at step 97 is:

$$\text{RESULT} = \text{gain\_adjust}*$$
$$(\text{result}(ADC1)*32 + \text{result}(ADC2) - calval(\text{ADC1\_result}) - ResOS).$$

As described more fully hereinbelow, the gain adjustment factor (gain_adjust) is computed by first determining the total sum of all bits (sum_of_cals=calval($2^{ADC1\_bits}$–1)+ResT) that are used to sample the analog input voltage Vin on the front-end ADC1, where ResT is the calibration result from the termination capacitor ($C_{TERM}$). In this example, the total sum of all bits sum_of_cals=calval($2^6$–1=63)+ResT. Using the total sum of all bits (sum_of_cals) value, the gain adjustment factor (gain_adjust) is then computed as gain_adjust=($2^N$)/($2^N$–sum_of_cals), where N is the resolution bits of the ADC (ADC1_bits+ADC2_bits–overlap bits). In this example, N=11 and gain_adjust=2048/(2048–sum_of_cals) where the 2048 comes from it being an 11-bit ADC overall (12 total bits minus 1 overlap bit).

At step 98, the ADC conversion methodology ends, and the pipelined SAR ADC outputs the selectively adjusted RESULT=gain_adjust*(result(ADC1)*G+result(ADC2)–calval(ADC1_result)–ResOS).

To provide additional details for an improved understanding of selected embodiments of the present disclosure, reference is now made to FIG. 10 which depicts a simplified flow chart 100 showing the logic for obtaining calibration values for all elements in a front-end ADC using the residue amplifier and one or more back-end ADCs. In an example embodiment, the processing shown in FIG. 10 may be performed with one or more SAR engine blocks embodied with dedicated hardware, software, or hybrid implementations and configured for controlling the front-end ADC stage to generate digital calibration values that are measured at a back-end ADC stage using a foreground self-calibration method.

After the method starts at step 101, the ADC conversion methodology 100 measures a combined offset voltage from residue amplifier and back-end ADC stage(s) using the back-end ADC stage(s) (step 102). With reference to the example shown in FIG. 2, the SAR logic blocks 14, 13 may be configured with control logic and/or hardware to disconnect the analog input voltage Vin from the DAC 12 and tri-state the input terminals V+, V– to the residue amplifier 21, thereby creating a residue voltage that the residue amplifier 21 amplifies for sampling and conversion by the back-end ADC stage 31 to provide a digital measure of the offset voltage (ResOS). Additional details for measuring the offset voltage in accordance with selected embodiments of the present disclosure are provided with reference to FIG. 11.

In the example embodiment of FIG. 2 where the residue amplifier 21 is connected between the front-end ADC1 stage 11 and the back-end ADC2 stage 31, the offset calibration step 102 shorts the V+, V– inputs to the residue amplifier 21, releases or tri-states the V+, V– inputs, then amplifies any residue voltage Vres at the V+, V– inputs using the residue amplifier to generate the amplified reside voltage G*Vres at the V1, V2 outputs to the residue amplifier, and then samples and converts the amplified residue voltage at the back-end ADC2 31 to generate the adc2_result (Result2) which contains the residue amplifier offset and ADC2 comparator offset (ResOS).

At step 103, the back-end ADC stage is used to measure the calibration values for single unit elements in the front-end DAC (e.g., capacitors having a unit capacitance value of C). Examples of single unit elements in the front-end DAC include the bit capacitor element (Cb0) and the termination capacitor element ($C_{TERM}$) which have a unit capacitance value of C, but may also include one or more redundant capacitor elements ($C_{RED}$). With reference to the example shown in FIG. 2, the SAR logic blocks 14, 34 may be used to measure each single unit value capacitor element in the front-end DAC1 12 by sampling Vrefh on the single unit value capacitor element being calibrated, and then switching to Vrefl to create a residue voltage Vres that is amplified by the residue amplifier 21 for sampling and conversion by the back-end ADC stage 31 to provide, after removing offset and subtracting from ideal ADC1 LSB value, a digital measure of the mismatch error voltage at the single unit value capacitor element being measured. During the measurement step 103, all capacitor elements in the DAC 12 (except for the single unit value capacitor element being calibrated) are held to a fixed voltage (e.g., Vrefl). Additional details for measuring the calibration values of single capacitor elements in accordance with selected embodiments of the present disclosure are provided with reference to FIG. 12.

In the example embodiment of FIG. 2, it will be appreciated that the front-end DAC1 12 can contain only binary decoding bit elements, only thermometer decoding elements, or a combination of thermometer and binary decoding elements. In other embodiments, the front-end DAC1 12 can also include one or more redundant bits. In such embodiments, the single unit element calibration measuring step 103 samples Vrefh on each single unit element being calibrated, and then switches to Vrefl to create a residue voltage at the V+, V– inputs to the residue amplifier 21 of Vres=Vlsb+Err(x), where Vlsb is the ideal LSB voltage of the front-end ADC1 11. In addition, the single unit element calibration measuring step 103 amplifies the residue voltage Vres for sampling on the back-end ADC2 31, and then converts the amplified residue voltage on the back-end ADC2 31 to generate the Result(x)=ResIdeal–(adc2_result(x)–ResOS), where ResIdeal is the ideal value of a single LSB in the front-end ADC1 11 as seen by the back-end ADC2 12. For example, ResIdeal=32 for a 6-bit ADC2 with one overlap bit. To account for the fact that there can be multiple single unit capacitors in the front-end DAC1 12, ResB(0) refers to the calibration value for bit-0, ResT refers to the calibration value for the termination capacitor, and ResR(x) refers to the calibration value for any redundant capacitor having bit position x.

At step 104, the back-end ADC stage is used to measure the multi-unit elements in the front-end DAC (e.g., capacitors having a capacitance value of k*C, where k is an integer greater than 1). With reference to the example shown in FIG. 2, the SAR logic blocks 14, 34 may be used to measure the multi-unit capacitor elements in the front-end DAC1 12 by first sampling Vrefh on the multi-unit capacitor elements being calibrated (e.g., capacitors having a capacitance value of k*C) while simultaneously sampling Vrefl on the previously calibrated capacitor elements (e.g., capacitors having a capacitance value of up to (k–1)*C). Subsequently, the SAR logic blocks 14, 34 switch the bottom plate polarities of the two capacitor groups to create a residue voltage Vres that is amplified by the residue amplifier 21 for sampling and conversion by the back-end ADC stage 31 to provide a digital measure of the mismatch error voltage at the multi-unit capacitor elements in the front-end DAC1 12 being measured. Additional details for measuring the calibration values of multi-unit capacitor elements in accordance with selected embodiments of the present disclosure are provided with reference to FIG. 12.

Continuing with the example embodiment of FIG. 2 where the front-end DAC1 12 can contain only binary decoding bit elements, thermometer decoding elements, and one or more redundant bits, the multi-unit element calibration measuring step 104 samples Vrefh on each group of capacitors being calibrated which have a capacitance value of k*C, and also samples Vrefl on k−1 previously-calibrated binary bit capacitors. For example, if k=4, then Vrefl is sampled on b1+b0 binary bits=3C. Subsequently, the multi-unit element calibration measuring step 104 swaps the bottom-plate polarities of the two groups (e.g., switch k*C to Vrefl and (k−1)*C to Vrefh) to create a residue voltage at the V+, V− inputs to the residue amplifier 21 of Vres=Vlsb+ Err(x), where Vlsb is the ideal LSB voltage of the front-end ADC1 11. In addition, the multi-unit element calibration measuring step 104 amplifies the residue voltage Vres for sampling on the back-end ADC2 31, and then converts the amplified residue voltage on the back-end ADC2 31 to generate the Result(x)=ResIdeal−(adc2_result(x)−ResOS), where ResIdeal is the ideal value of a single LSB in the front-end ADC1 11 as seen by the back-end ADC2 12. To account for the fact that there can be multiple multi-unit capacitors in the front-end DAC1 12, ResB(x) refers to the calibration value for binary bit results, ResG(x) refers to the calibration values for the thermometer code groups, and ResR(x) refers to the calibration value for any redundant capacitor having bit position x.

At step 105, the calibration values computed at steps 103-104 are combined to create a summed calibration value for use when performing ADC conversions. With reference to the example shown in FIG. 2 where the front-end DAC1 21 contains only binary decode capacitor elements (without thermometer decode elements or redundant decode elements), the SAR logic and calibration control logic 14 may be used to create the summed calibration value (calval(R)) for each possible conversion result R from the front-end ADC stage by computing:

$$calval(R) = \sum_{b=0}^{B-1} \text{int}\left(\frac{R+2^b}{2^b+1}\right) * ResB(b),$$

where R=the ADC1 conversion result index, b is the capacitor element being evaluated, B=# of binary bits, and where ResB(b) is the binary bit (b) calibration result measured at step 103 or 104.

In other embodiments where the front-end DAC1 21 contains a combination of binary decode capacitor elements, thermometer decode elements, and/or redundant decode elements, the SAR logic and calibration control logic 14 may be used to create the summed calibration value (calval (R)) for each possible conversion result R from the front-end ADC stage by computing:

$$calval(R) =$$

$$\sum_{b=0}^{B-1} \text{int}\left(\frac{R+2^b}{2^b+1}\right) * ResB(b) + \sum_{x=1}^{\text{int}\left(\frac{B}{2^B}\right)} ResG(x) + \sum_{l=0}^{L-1} ResR(l),$$

where R=the ADC1 conversion result index, b is the binary weighted capacitor element index, B=# of binary bits, and where ResB(b) is the binary bit (b) calibration result measured at step 103 or 104. In addition, x is the thermometer group index and ResG(x) is the thermometer group (x) calibration result measured at step 103 or 104. In addition, l is the redundant capacitor element index, L=# of redundant bits, and ResR(l) is the redundant bit calibration result measured at step 103 or 104. However computed, the summed calibration values calval(R) computed at step 105 may be stored in the calibration storage 22.

At step 106, a gain adjustment factor is computed based on the total sum of all bits (sum_of_cals) that are used to sample the analog input voltage Vin on the front-end ADC1 having ADC1_bits. With reference to the example shown in FIG. 2, the SAR logic and calibration control logic 14 and/or result adder 23 may be configured to compute the gain adjustment factor:

$$gain\_adjust = (2^N)/(2^N - sum\_of\_cals),$$

where N is the resolution bits of the ADC (e.g., N=ADC1_bits+ADC2_bits−overlap bits), and where sum_of_cals is the total sum of all bits that are used to sample the analog input voltage Vin on the front-end ADC1. As disclosed herein, the term sum_of_cals may be computed as:

$$sum\_of\_cals = calval(2^{ADC1\_bits} - 1) + ResT,$$

where ResT is the calibration result from the termination capacitor ($C_{TERM}$). Subsequently during the ADC conversion operation, the gain adjustment factor (gain_adjust) is multiplied with the calibrated SAR ADC result(result (ADC1)*G+result(ADC2)−calval(ADC1_result)−ResOS)), thereby computing the final RESULT=gain_adjust*(result (ADC1)*G+result(ADC2)−calval(ADC1_result)−ResOS).

As an alternative embodiment of the ADC conversion methodology 100, the processing steps for creating summed calibration values in step 105 may be simplified and an additional step 107 may be performed to calculate an average calibration result for non-offset tests and to subtract the average calibration result from the non-offset calibration results. In this alternate embodiment, the simplified processing at step 105 is performed to create a summed calibration value calval($2^{ADC1\_bits}$−1), but the remainder of the summed calibration values calval(1: $2^{ADC1\_bits}$−2) would not need to be computed. Based on the summed calibration value calval ($2^{ADC1\_bits}$−1), the sum_of_cals term may be computed at step 106. And at step 107, an average calibration result avg_of_cals may be computed by shifting the sum_of_cals term by the number of bits in the front-end ADC1 (ADC1_bits) or by dividing by $2^{ADC1\_bits}$ (e.g., avg_of_cals=sum_of_cals>>ADC1_bits=sum_of_cals/ $2^{ADC1\_bits}$). With reference to the example shown in FIG. 2, if the front-end ADC1 has a 6-bit DAC 12, then the average calibration result is avg_of_cals=sum_of_cals>>6. The computation step 107 also subtracts the average calibration result for each non-offset test from the non-offset calibration results, such as by computing:

$$NewResT = ResT - avg\_of\_cals,$$

$$NewResB(b) = ResB(b) - avg\_of\_cals \text{ for all } b,$$

$$NewResG(x) = ResG(x) - avg\_of\_cals \text{ for all } x, \text{ and}$$

$$NewResR(l) = ResR(l) - avg\_of\_cals \text{ for all } l.$$

Finally the computation step 107 recalculates the calibration values with the formula:

$$calval'(R) =$$

$$\sum_{b=0}^{B-1} \text{int}\left(\frac{R+2^b}{2^{b+1}}\right) * NewResB(b) + \sum_{x=1}^{int\left(\frac{R}{2^B}\right)} NewResG(x) + \sum_{l=0}^{L-1} NewResR(l)$$

As disclosed herein, the gain adjust factor computed at step 106 should not be altered when using step 107 to recalculate calibration values, but should only be applied to the ADC2 result rather than the combined ADC result. Based on the foregoing, the final resulting calibrated SAR ADC result is computed as:

$$RESULT = result(ADC1) * 32 +$$

$$gain\_adjust * (result(ADC2) - calval'(ADC1\_result) - ResOS).$$

To provide additional details for an improved understanding of selected embodiments of the present disclosure, reference is now made to FIG. 11 which depicts a simplified flow chart 110 showing the logic for measuring an offset value for the residue amplifier and back-end ADC(s) using one or more back-end ADCs. In an example embodiment, the processing shown in FIG. 11 may be performed with one or more SAR engine blocks embodied with dedicated hardware, software, or hybrid implementations and configured for controlling the front-end and back-end ADC stages to generate digital calibration values measuring the voltage offset that is measured at a back-end ADC stage.

At step 112, the bottom plates of all capacitors in the front-end DAC are charged to Vrefl and the top plates of all capacitors in the front-end DAC are charged to the common voltage Vcm. With reference to the example shown in FIG. 2, the SAR logic block 14 may be used to generate sampling DAC1 control feedback signals which disconnect the analog input voltage Vin from the bottom capacitor plates in the DAC 12. In addition, the SAR logic block 14 may issue switching control signals to close the switches S1, S2, thereby shorting the top plates of the front-end DAC capacitors and the input terminals V+, V− of the residue amplifier 21 to the common mode voltage Vcm.

At step 113, the top plates of all capacitors in the front-end DAC are released or disconnected from the common voltage Vem, thereby creating a near-zero residue voltage Vres at the inputs to the residue amplifier. With reference to the example shown in FIG. 2, the SAR logic block 14 may be used to generate switching control signals to open the switches S1, S2 to disconnect the input terminals V+, V− of the residue amplifier 21 from the common mode voltage Vcm.

At step 114, any residue voltage is amplified by the residue amplifier to generate an amplified residue voltage (e.g., G*Vres) which is sampled by the back-end ADC stage. With reference to the example shown in FIG. 2, the residue amplifier 21 has a gain of G to generate an amplified residue voltage G*Vres, and the SAR logic block 34 may be used to generate sampling DAC2 control feedback signals to sample the amplified residue voltage on the back-end DAC2 32.

At step 115, the back-end ADC stage converts the amplified residue voltage to generate a digital measure of the offset voltage at the residue amplifier and a back-end comparator. With reference to the example shown in FIG. 2, the SAR logic block 34 may be configured to generate conversion DAC2 control feedback signals to the DAC2 32 to generate the digital ADC2 SAR result (RESULT2) from the back-end ADC2 31.

At step 116, the back-end ADC stage stores the offset result in the calibration circuit or storage. With reference to the example shown in FIG. 2, the result adder 23 may be configured to store the residue amplifier offset result in the calibration storage unit 22.

Figure 12:
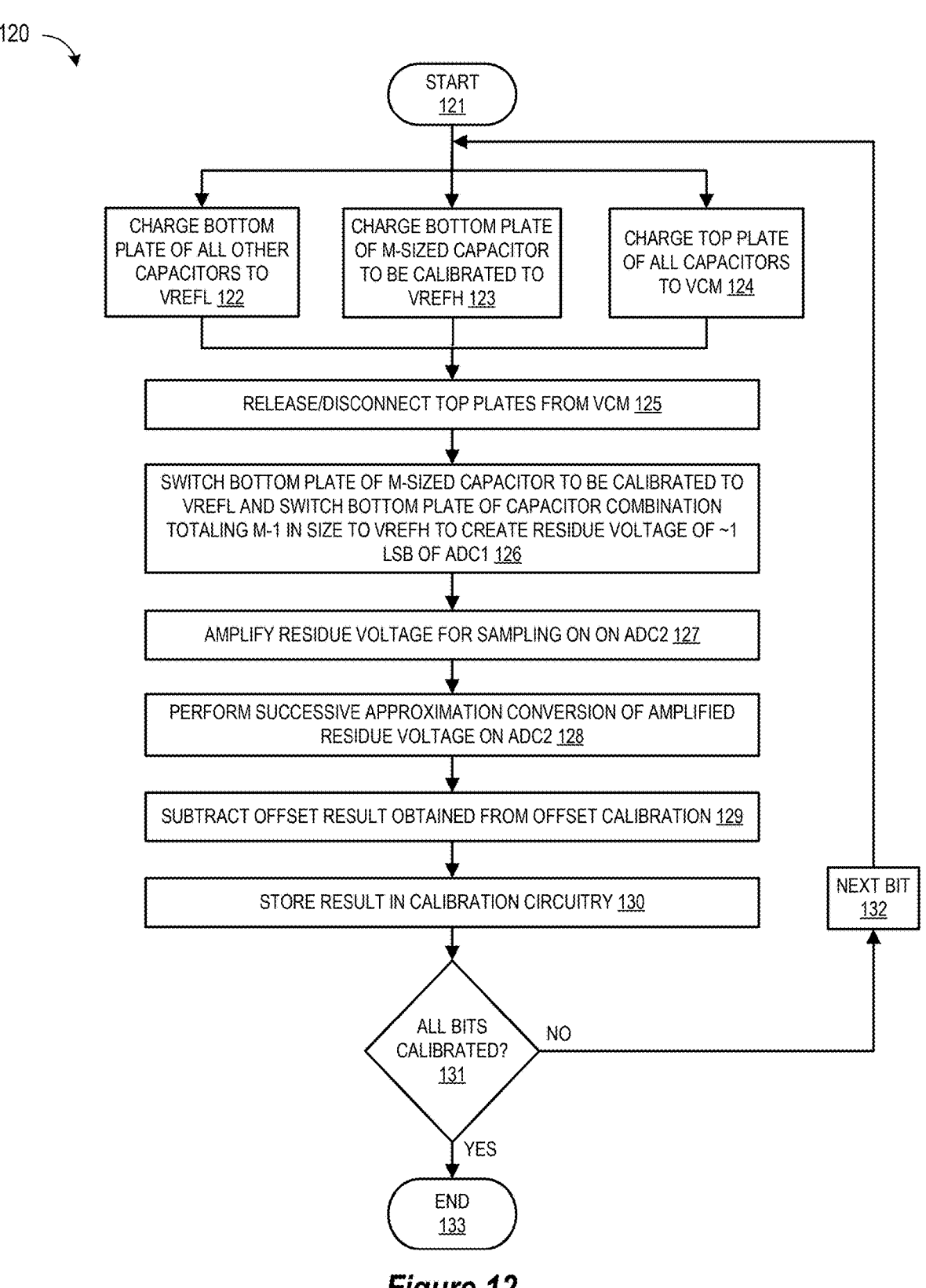
FIG. 12 depicts a simplified flow chart showing the logic for calibrating single-unit elements and multi-unit elements in the front-end ADC using one or more back-end ADCs in accordance with selected embodiments of the present disclosure.

To provide additional details for an improved understanding of selected embodiments of the present disclosure, reference is now made to FIG. 12 which depicts a simplified flow chart 120 showing the logic for calibrating single-unit elements and multi-unit elements in the front-end ADC using one or more back-end ADCs. In an example embodiment, the processing shown in FIG. 12 may be performed with one or more SAR engine blocks embodied with dedicated hardware, software, or hybrid implementations and configured for controlling a residue amplifier and one or more back-end ADC stages to generate digital calibration measures of the capacitor element mismatch offsets in a front-end ADC stage.

In describing the calibration method with reference to the pipelined SAR ADC depicted in FIG. 2, calibration values are obtained for the capacitor elements in the front-end stage DAC1 12 which are the most significant bits (MSB) of the pipelined SAR ADC. For each calibration, control values can be sent as a multi-bit DAC1 feedback control signal to the first DAC1 12 from the SAR logic and calibration control block 14 in order to couple the capacitors appropriately to Vrefh or Vrefl. As disclosed herein, obtaining a calibration value for each capacitor element in the first DAC1 12 includes individually measuring the selected capacitor element or groups of elements by using them to generate a residue voltage, amplifying the residue voltage and measuring with the back-end ADC(s). For each back-end ADC result (provided by ADC2 31), an approximation for the mismatch of the selected capacitor element or groups of elements is obtained by subtracting the offset from the result and then subtracting that difference from the ideal result.

The disclosed calibration method determines residue voltages for each capacitor element(s) in the first DAC1 12. In particular, each capacitor element of the first DAC1 12 is selected and processed in turn. In selected embodiments, each capacitor element is selected in order, from Bit(N−1) to Bit(0). After the method starts at step 121, the calibration methodology begins with sample phase processes 122, 123, 124. Process 123 charges the bottom plate(s) of the M-sized capacitor to be calibrated to Vrefh in the sample phase. Process 122 charges the bottom plate of all other capacitors (including the termination capacitor any redundant capacitor(s)) to Vref, and process 124 charges the top plate of all capacitors (including the termination capacitor any redundant capacitor(s)) to the common voltage Vcm. As illustrated with the example DAC 301 shown in FIG. 3, the first time through the calibration method, Bit(N−1) is first selected and processed, such that Bit(N−1) is the current capacitor being calibrated. In this example, the bottom plate of Bit(N−1) is charged to Vrefh and the top plate of Bit(N−1) is charged to Vem, while the bottom plates of the remaining capacitor elements are all charged to Vrefl in the sample phase. The processes 122-124 can be performed simultaneously in the sample phase.

After performing processes 122-124, the calibration method transitions to process 125 where the top plates of all capacitor elements in the first DAC1 12 are released or disconnected from the common voltage Vcm. As illustrated with the example DAC 301 shown in FIG. 3, the top capacitor plates may be released by opening the switch 302, disconnecting the top plates of the capacitors from the common voltage Vcm.

After the front-end ADC sampling phase, the calibration method then proceeds to the front-end ADC approximation phase (a.k.a., the SAR approximation phase or comparison phase) which begins with process 126 which switches the bottom plate of the M-sized capacitor being calibrated in the front-end DAC to Vrefl for the approximation phase. In addition, the process 126 switches to Vrefh the bottom plate(s) of the capacitor combination totaling M−1 in size in the front-end DAC. As a result, the process 126 creates a residue voltage or offset of approximately 1 LSB of the front-end ADC1 stage.

As will be appreciated, the combination of M−1 sized capacitors, if >0, should be comprised of lower-significance binary bits. For example, if the capacitor element for bit-1 (M=2) is being calibrated, then the combination of M−1 sized capacitors would include only the capacitor element for bit-0 (M=1). And if the capacitor element for bit-2 (M=4) is being calibrated, then the M−1 group would contain the capacitor elements bit-1 and bit-0 (M=3). If the capacitor element for bit-0 or another (M=1) is being calibrated, then M−1=0, so no capacitor bottom plates are switched to Vrefh during process 126.

At process 127, the calibration method amplifies the residue voltage for sampling by the back-end ADC2 stage. As illustrated with the example shown in FIG. 3, the residue voltage generated at process 126 is received by the residue amplifier 39 where it is amplified for sampling and conversion by the back-end ADC2 41.

At process 128, the calibration method continues with the back-end ADC approximation phase by performing successive-approximation conversion of the amplified residue voltage on the back-end ADC stage so as to approximate the capacitor mismatch for the selected capacitor element(s) in the front-end ADC stage. The result of process 128 is to provide a digital representation of the capacitor mismatch between the M-sized capacitor being calibrated in the front-end DAC and, if M>0, the M−1 capacitor(s) in the front-end DAC (including the termination capacitor). The result of the back-end ADC approximation phase may be adjusted and stored in the calibration storage unit 21.

Since the result of the successive approximation process 128 includes the offset of the residue amplifier and back-end ADC, the calibration method transitions to process 129 wherein the offset results obtained from the offset calibration process (calval(R)) are subtracted from the result of the successive approximation process step 128, thereby generating an adjusted approximation value.

At process 130, the adjusted approximation result is stored in calibration circuitry. As illustrated with the example shown in FIG. 2, the adjusted approximation value generated at process 129 may be stored in the calibration storage unit 22.

At process 131, the calibration process determines if all of the capacitor bits have been calibrated. If so (affirmative outcome to process 131), then the calibration method ends. But if not (negative outcome to process 131), then the next capacitor is selected as the current capacitor to be calibrated, and the calibration process iteratively repeats until all capacitor bits have been calibrated, and the calibration process ends (step 133).

Referring back to the ADC conversion method 90 depicted in FIG. 9, there is now provided a description of an example calibration process with a front-end DAC1 12 that is a 6-bit ADC1 with 4 thermometer coded bits, 2 binary bits, and one redundant bit. In this example, the calibration measurement steps 102, 103, 104 (shown in FIG. 10) are performed to generate calibration measurement ResOS, ResB(1:0) for the two binary bits, ResG(15:1) for the thermometer bits, and ResR(0) for the redundant bit. Based on these values, the processing step 105 for creating summed calibration values computes the summed calibration values calval(1)-calval(63) using the equation:

$$calval(R) =$$
$$int\left(\frac{R+1}{2}\right) * ResB(0) + int\left(\frac{R+2}{4}\right) * ResB(1) + \sum_{x=1}^{int\left(\frac{R}{4}\right)} ResG(x) + ResR(0).$$

As a result, the following summed calibration values are created:

$$calval(1) = ResB(0)$$
$$calval(2) = ResB(0) + ResB(1)$$
$$calval(3) = 2 * ResB(0) + ResB(1)$$
$$calval(4) = 2 * ResB(0) + ResB(1) + ResG(1)$$
$$calval(5) = 3 * ResB(0) + ResB(1) + ResG(1)$$
$$calval(6) = 3 * ResB(0) + 2 * ResB(1) + ResG(1)$$
$$calval(7) = 4 * ResB(0) + 2 * ResB(1) + ResG(1)$$
$$calval(8) = 4 * ResB(0) + 2 * ResB(1) + ResG(1) + ResG(2)$$
$$calval(9) = 5 * ResB(0) + 2 * ResB(1) + ResG(1) + ResG(2)$$
$$calval(10) = 5 * ResB(0) + 3 * ResB(1) + ResG(1) + ResG(2)$$
$$\cdots$$
$$calval(61) = 31 * ResB(0) + 15 * ResB(1) + SUM(ResG(1)\dots ResG(15))$$
$$calval(62) = 31 * ResB(0) + 16 * ResB(1) + SUM(ResG(1)\dots ResG(15))$$
$$calval(63) = 32 * ResB(0) + 16 * ResB(1) + SUM(ResG(1)\dots ResG(15)).$$

Finally, the gain adjustment factor computation step 106 is performed to compute the sum_of_cals=calval(63)+ResT, and to compute the gain adjustment factor, gain_adjust=$2^N/(2^N$−sum_of_cals), where N is bit resolution of the ADC, 6+ADC2_bits−1 (assuming 1 overlap bit between ADC1 and ADC2).

During normal ADC conversion operations, the final result calculation step 97 modifies the ADC2 result generated at step 96 by using step 95 to retrieve one of the summed calibration values calval(R) defined above, based on the ADC1 result value R, as set forth below:

If the ADC1 result bits (5:0)=0, no calval is subtracted from the ADC2 result.

If the ADC1 result bits (5:0)=1, subtract calval(1) from the ADC2 result.

If the ADC1 result bits (5:0)=2, subtract calval(2) from the ADC2 result.

If the ADC1 result bits (5:0)=3, subtract calval(3) from the ADC2 result.

If the ADC1 result bits (5:0)=4, subtract calval(4) from the ADC2 result.

If the ADC1 result bits (5:0)=5, subtract calval(5) from the ADC2 result.

If the ADC1 result bits (5:0)=6, subtract calval(6) from the ADC2 result.

If the ADC1 result bits (5:0)=7, subtract calval(7) from the ADC2 result.

If the ADC1 result bits (5:0)=8, subtract calval(8) from the ADC2 result.

If the ADC1 result bits (5:0)=9, subtract calval(9) from the ADC2 result.

If the ADC1 result bits (5:0)=10, subtract calval(10) from the ADC2 result.

. . .

If the ADC1 result bits (5:0)=61, subtract calval(61) from the ADC2 result.

If the ADC1 result bits (5:0)=62, subtract calval(62) from the ADC2 result.

If the ADC1 result bits (5:0)=63, subtract calval(63) from the ADC2 result.

For each case, if the redundant bit remained asserted during the SAR, also subtract ResR(0) from the ADC2 result.

After subtracting the above calval(R) value from the ADC2 result to obtain the modified ADC2 result, the final result calculation step 97 combines the ADC1 result, the modified ADC2 result, and the ResOS value, and then multiplies the combined result by the gain adjustment factor (gain_adjust).

Another option disclosed herein for reducing the computational and memory storage requirements is for the calibration process to create avg_of_cals=sum_of_cals>>6 (sum_of_cals/64), and then replace all Res* terms in the formula above with NewRes*, and then apply the gain_adjust only to the ADC2 result.

As will be appreciated, the simplified flow charts depicted in FIGS. 9-12 describe the calibration control logic and ADC conversion methodology for using a pipelined SAR ADC which use a single-ended ADC1 stage. However, it will be appreciated that similar steps would be used for a SAR ADC which uses differential ADC1 stage to calibrate capacitors of both the plus and minus DAC arrays. Also, it will be appreciated that the back-end ADC2 stage could use a DAC which employes either top-plate or bottom-plate sampling. Thus, the sampling of the amplified residue on the back-end ADC2 stage would require connecting amplifier outputs to either the top plates or bottom plates (respectively) of back-end ADC2 stage while connecting the other plates to Vcm (in the case of a bottom plate-sampling ADC2) or a combination of Vrefh/Vrefl (in the case of a top plate-sampling ADC2).

As disclosed herein, the method, system, and apparatus for calibrating and operating a pipelined SAR ADC may be implemented with a multi-stage successive approximation register architecture embodied with dedicated hardware, software, or hybrid implementations that is connected and controlled by control logic and/or computer program product having program code portions for performing steps of a method and/or for performing functions of a device or system in which foreground self-calibration processing uses the residue amplifier and back-end ADC stage to quantify element mismatch, offset, and parasitic effects that can be used to calibrate and adjust the SAR conversion results from the front-end and back-end ADC stages. Although embodiments are described in the context of an example pipelined SAR ADC, the description of the architecture has been simplified for purposes of discussion, and it is just one of many different types of appropriate architectures that may be used in accordance with the disclosed calibration computation method, system, and apparatus.

Those skilled in the art will recognize that the boundaries between logic blocks and circuit elements are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

By now it should be appreciated that there has been provided an apparatus, method, program code, and system for controlling a pipelined successive approximation register (SAR) analog-to-digital converter (ADC) that includes a front-end ADC stage, a residue amplifier, a back-end ADC stage, and calibration circuitry. The disclosed front-end ADC stage includes a front-end digital-to-analog converter (DAC) connected to receive an analog input voltage and configured to output a residue voltage signal and to generate a first ADC conversion result by sampling and converting the analog input voltage with a front-end SAR circuit block. In selected embodiments, the front-end ADC stage includes a plurality of DAC elements and a termination element in the front-end DAC coupled to receive the analog input voltage, a high reference voltage, and a low reference voltage, and to provide a first output voltage; a first comparator having a first input to receive the first output voltage of the front-end DAC, a second input, and a first comparator output, where the first comparator is configured to generate a first comparison output based on a difference in voltage between the first input and the second input; and successive-approximation-register (SAR) circuitry having an input coupled to receive the first comparison output, and a first SAR output to provide the uncalibrated digital value corresponding to an uncalibrated digital representation of the analog input voltage. The disclosed residue amplifier is connected to receive the residue voltage signal and to generate an amplified residue voltage signal. The disclosed back-end ADC stage includes a back-end DAC connected to receive the amplified residue voltage signal and configured to generate a second ADC conversion result by sampling and converting the amplified residue voltage signal with a back-end SAR circuit block. In selected embodiments, the back-end ADC stage includes a plurality of DAC elements and a termination element in the back-end DAC coupled to receive the amplified residue voltage, the high reference voltage, and the low reference voltage, and to provide an second output voltage; a second comparator having a first input to receive the second output voltage of the back-end DAC, a second input, and a second comparator output, where the second comparator is configured to generate a second comparison output based on a difference in voltage between the first input and the second input; and successive-approximation-register (SAR) circuitry having an input coupled to receive the second comparison output, and a second SAR output to provide the uncalibrated digital value corresponding to an uncalibrated digital representation of the amplified residue voltage. The disclosed calibration circuitry is coupled and configured to add the first and second ADC conversion results to form an uncalibrated digital value, and to apply a plurality of calibration values to digitally adjust the uncalibrated digital value to obtain a calibrated digital value corresponding to a calibrated digital representation of the analog input voltage. As disclosed, the plurality of calibration values includes a DAC element mismatch calibration value corresponding to the first ADC conversion result, an offset calibration value which includes a residue amplifier offset value and a back-end ADC stage offset value, and a gain adjustment factor. In selected embodiments, the calibration circuitry is configured to apply the plurality of calibration values to the uncalibrated digital value by computing a difference value by subtracting the DAC element mismatch calibration value and the offset calibration value from the uncalibrated digital value, and then multiplying the gain adjustment factor with the difference value to obtain the calibrated digital value. In other selected embodiments, the calibration circuitry is configured to compute the offset calibration value by shorting together and then releasing inputs to the residue amplifier, and then sampling and converting the amplified residue voltage with the back-end ADC stage to generate the second ADC conversion result which contains the offset calibration value. In selected embodiments where the front-end DAC includes a plurality of DAC elements, the calibration circuitry may be configured to obtain a DAC element mismatch calibration value for each DAC element in the plurality of DAC elements of the front-end DAC by using the front-end SAR circuit block to individually compare a capacitance of each selected DAC element to zero or more other DAC elements in the front-end DAC. In such embodiments, the calibration circuitry may be configured to generate the DAC element mismatch approximation value for each individual DAC element by switching the elements to create a residue voltage, amplifying the residue voltage with the residue amplifier, and using the back-end SAR circuit block to perform successive approximation of the amplifed residue voltage signal.

In another form, there has been provided a foreground self-calibration method, apparatus, program code, and system for calibrating a pipelined successive approximation analog-to-digital converter (SAR ADC) having a front-end ADC stage connected over a residue amplifier to a back-end ADC stage. The disclosed calibration method includes computing an offset calibration value for the residue amplifier and back-end ADC stage by using the back-end ADC stage to provide a digital measure of the offset voltage of the residue amplifier and back-end ADC stage. In selected embodiments, the offset calibration value is computed by tri-stating input terminals into the residue amplifier to create a residue voltage that the residue amplifier amplifies for sampling and conversion by the back-end ADC stage to provide the digital measure of the offset voltage of the residue amplifier and back-end ADC stage. The disclosed calibration method also includes computing an element mismatch calibration value for each digital-to-analog converter (DAC) element in a front-end DAC of the front-end ADC stage by switching a plurality of DAC elements in the front-end DAC to generate a residue voltage input to the residue amplifier that is roughly in the range of −1 to +1 least significant bit (LSB) of the front-end ADC stage and using the back-end ADC stage to measure an amplified residue voltage generated by the residue amplifier after for each selected DAC element being calibrated. In selected embodiments, the element mismatch calibration value is computed by measuring each single unit value DAC element being calibrated in the front-end DAC by sampling a high reference voltage Vrefh on the single unit value DAC element, and then switching the single unit value DAC element being calibrated to a low reference voltage Vrefl to create a residue voltage Vres that is amplified by the residue amplifier for sampling and conversion by the back-end ADC stage. In selected embodiments, measuring each single unit value DAC element being calibrated in the front-end DAC includes a sampling phase and an approximation phase. In the sampling phase of measuring each single unit value DAC element, all top capacitor plates of the DAC elements are charged to a common mode voltage, a bottom capacitor plate of the DAC element being calibrated is charged to a high reference voltage Vrefh, and all bottom capacitor plates of the DAC elements except the DAC element being calibrated are charged to a low reference voltage Vrefl, and then all top capacitor plates of the DAC elements are disconnected from the common mode voltage at the end of the sample phase. In the approximation phase of measuring each single unit value DAC element, the bottom capacitor plate of the DAC element being calibrated is charged to the low reference voltage Vrefl, and the back-end ADC stage is used to run a successive approximation measure on the amplified residue voltage generated by the residue amplifier to obtain a first approximation result for the element mismatch calibration value for the single unit DAC element being calibrated in the front-end DAC. In other selected embodiments, the element mismatch calibration value is computed by measuring each multi-unit value DAC element being calibrated in the front-end DAC by sampling a high reference voltage Vrefh on the multi-unit value DAC element, and then switching the multi-unit value DAC element being calibrated to a low reference voltage Vrefl to create a residue voltage Vres that is amplified by the residue amplifier for sampling and conversion by the back-end ADC stage. In selected embodiments, measuring each multi-unit value DAC element having a capacitance value of k*C being calibrated in the front-end DAC includes a sampling phase and an approximation phase. In the sampling phase of measuring each multi-unit value DAC element having a capacitance value of k*C, all top capacitor plates of the DAC elements are charged to a common mode voltage, a bottom capacitor plate of the multi-unit DAC element having a capacitance value of k*C is charged to a high reference voltage Vrefh, and all bottom capacitor plates of the DAC elements having a capacitance value of (k−1)*C are charged to a low reference voltage Vrefl, and then all top capacitor plates of the DAC elements are disconnected from the common mode voltage at the end of the sample phase. In the approximation phase of measuring each multi-unit value DAC element having a capacitance value of k*C, the bottom capacitor plate of the multi-unit value DAC element having a capacitance value of k*C is charged to the low reference voltage Vrefl, all bottom capacitor plates of the DAC elements having a capacitance value of (k−1)*C is charged to the high reference voltage Vrefh, and the back-end ADC stage is used to run a successive approximation measure on the amplified residue voltage generated by the residue amplifier to obtain a first approximation result for the element mismatch calibration value for the multi-unit DAC element being calibrated in the front-end DAC. In addition, the disclosed calibration method includes computing one or more summed calibration values for one or more first ADC conversion results based on one or more of the computed element mismatch calibration values. The disclosed calibration method also includes computing a gain adjustment value based on a total sum of all DAC elements in the front-end ADC stage that are used to sample an analog input voltage. In selected embodiments, the foreground self-calibration method also includes generating first and second ADC conversion results from the front-end ADC stage and back-end ADC stage to form an uncalibrated SAR ADC result; subtracting, from the uncalibrated SAR ADC result, the offset calibration value and a summed calibration value selected from the one or more summed calibration values corresponding to the first ADC conversion result to form a difference value; and multiplying the gain adjustment factor with the difference value to obtain the calibrated SAR ADC result from the pipelined SAR ADC. In selected embodiments, the plurality of DAC elements in the front-end DAC include a plurality of DAC capacitors, a termination DAC capacitor, and one or more redundant DAC capacitors.

In yet another form, there is provided a pipelined successive approximation register analog-to-digital converter (SAR ADC) which includes a front-end ADC connected over a residue amplifier to a back-end ADC. The disclosed front-end ADC includes a first digital-to-analog converter (DAC) configured to receive a first input voltage signal, a high voltage reference, and a low voltage reference, and to generate therefrom a first DAC output, wherein the first DAC includes a plurality of bits encoded with one or more first DAC capacitors. The disclosed front-end ADC also includes a first comparator having a first input coupled to receive the first DAC output, a second input, and a first comparator output, the first comparator configured to generate a differential comparison of the first and second inputs at the first comparator output. In addition, the disclosed front-end ADC includes a successive-approximation-register (SAR) logic and calibration control block having an input coupled to receive the first comparator output, wherein the SAR logic and calibration control block is configured to provide a first ADC conversion result representation of the analog input voltage and to generate feedback control signals to the first DAC. The disclosed back-end ADC includes a second DAC configured to receive an amplified residue voltage from the residue amplifier, a high voltage reference, and a low voltage reference, and to generate therefrom a second DAC output, wherein the second DAC includes a plurality of bits encoded with one or more second DAC capacitors. The disclosed back-end ADC also includes a second comparator having a first input coupled to receive the first DAC output, a second input, and a second comparator output, the second comparator configured to generate a differential comparison of the first and second inputs at the second comparator output. In the disclosed SAR ADC, the SAR logic and calibration control block is configured to provide control signals to the front-end ADC and back-end ADC to measure an offset calibration value for the residue amplifier and back-end ADC by tri-stating input terminals into the residue amplifier to create a residue voltage that the residue amplifier amplifies for sampling and conversion by the back-end ADC. In selected embodiments, the SAR logic and calibration control block is configured to provide control signals to the front-end ADC and back-end ADC to measure an element mismatch calibration value for each of the one or more first DAC capacitors in the first DAC by switching a plurality of DAC capacitors in the first DAC to generate a residue voltage input to the residue amplifier that is roughly in the range of −1 to +1 least significant bit (LSB) of the front-end ADC and using the back-end ADC to measure an amplified residue voltage generated by the residue amplifier after for each selected DAC capacitor being calibrated. In other selected embodiments, the SAR logic and calibration control block is configured to compute one or more summed calibration values for one or more first ADC conversion results based on one or more of the measured element mismatch calibration values, and to compute a gain adjustment value based on a total sum of all DAC capacitors in the front-end ADC that are used to sample the analog input voltage.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary pipelined SAR ADC, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A pipelined successive approximation register (SAR) analog-to-digital converter (ADC) comprising:

a front-end ADC stage comprising a front-end digital-to-analog converter (DAC) connected to receive an analog input voltage and configured to output a residue voltage signal and to generate a first ADC conversion result by sampling and converting the analog input voltage with a front-end SAR circuit block;

a residue amplifier connected to receive the residue voltage signal and to generate an amplified residue voltage signal;

a back-end ADC stage comprising a back-end DAC connected to receive the amplified residue voltage signal and configured to generate a second ADC conversion result by sampling and converting the amplified residue voltage signal with a back-end SAR circuit block; and calibration circuitry coupled and configured to add the first and second ADC conversion results to form an uncalibrated digital value, and to apply a plurality of calibration values to digitally adjust the uncalibrated digital value to obtain a calibrated digital value corresponding to a calibrated digital representation of the analog input voltage, where the plurality of calibration values comprises:

a DAC element mismatch calibration value corresponding to the first ADC conversion result, an offset calibration value comprising a residue amplifier offset value and a back-end ADC stage offset value, and a gain adjustment factor.

2. The pipelined SAR ADC of claim 1, where the front-end ADC stage comprises:

a plurality of DAC elements and a termination element in the front-end DAC coupled to receive the analog input voltage, a high reference voltage, and a low reference voltage, and to provide a first output voltage;

a first comparator having a first input to receive the first output voltage of the front-end DAC, a second input, and a first comparator output, where the first comparator is configured to generate a first comparison output based on a difference in voltage between the first input and the second input; and successive-approximation-register (SAR) circuitry having an input coupled to receive the first comparison output, and a first SAR output to provide the uncalibrated digital value corresponding to an uncalibrated digital representation of the analog input voltage.

3. The pipelined SAR ADC of claim 1, where the back-end ADC stage comprises:

a plurality of DAC elements and a termination element in the back-end DAC coupled to receive the amplified residue voltage, the high reference voltage, and the low reference voltage, and to provide an second output voltage;

a second comparator having a first input to receive the second output voltage of the back-end DAC, a second input, and a second comparator output, where the second comparator is configured to generate a second comparison output based on a difference in voltage between the first input and the second input; and successive-approximation-register (SAR) circuitry having an input coupled to receive the second comparison output, and a second SAR output to provide the uncalibrated digital value corresponding to an uncalibrated digital representation of the amplified residue voltage.

4. The pipelined SAR ADC of claim 1, where the calibration circuitry is configured to apply the plurality of calibration values to the uncalibrated digital value by computing a difference value by subtracting the DAC element mismatch calibration value and the residue amplifier offset calibration value from the uncalibrated digital value, and then multiplying the gain adjustment factor with the difference value to obtain the calibrated digital value.

5. The pipelined SAR ADC of claim 1, wherein the calibration circuitry is configured to compute the offset calibration value by shorting together and then releasing the inputs to the residue amplifier, and then sampling and converting the amplified residue voltage with the back-end ADC stage to generate the second ADC conversion result which contains the offset calibration value.

6. The pipelined SAR ADC of claim 1, wherein the front-end DAC comprises a plurality of DAC elements, and wherein the calibration circuitry is configured to obtain a DAC element mismatch calibration value for each DAC element in the plurality of DAC elements of the front-end DAC by using the front-end SAR circuit block to individually compare a capacitance of each selected DAC element to a combination of zero or more other DAC elements in the front-end DAC in a way that limits the residue voltage and avoids saturating the back-end ADC.

7. The pipelined SAR ADC of claim 6, wherein the calibration circuitry is configured to generate the DAC element mismatch approximation value for each individual DAC element by using the back-end SAR ADC circuit block to perform successive approximation of the amplifed residue voltage signal.

8. A foreground self-calibration method for calibrating a pipelined successive approximation analog-to-digital converter (SAR ADC) comprising a front-end ADC stage connected over a residue amplifier to a back-end ADC stage, the foreground self-calibration method comprising:

computing an offset calibration value for the residue amplifier and back-end ADC stage by using the back-end ADC stage to provide a digital measure of the offset voltage of the residue amplifier and back-end ADC stage;

computing an element mismatch calibration value for each digital-to-analog converter (DAC) element in a front-end DAC of the front-end ADC stage by switching a plurality of DAC elements in the front-end DAC to generate a residue voltage input to the residue amplifier that is roughly in the range of −1 to +1 least significant bit (LSB) of the front-end ADC stage and using the back-end ADC stage to measure an amplified residue voltage generated by the residue amplifier after for each selected DAC element being calibrated;

computing one or more summed calibration values for one or more first ADC conversion results based on one or more of the computed element mismatch calibration values; and computing a gain adjustment value based on a total sum of all DAC elements in the front-end ADC stage that are used to sample an analog input voltage.

9. The foreground self-calibration method of claim 8, further comprising:

generating first and second ADC conversion results from the front-end ADC stage and back-end ADC stage to form an uncalibrated SAR ADC result;

subtracting, from the uncalibrated SAR ADC result, the offset calibration value and a summed calibration value selected from the one or more summed calibration values corresponding to the first ADC conversion result to form a difference value; and multiplying the gain adjustment factor with the difference value to obtain the calibrated SAR ADC result from the pipelined SAR ADC.

10. The foreground self-calibration method of claim 8, where computing the offset calibration value comprises tri-stating input terminals into the residue amplifier to create a residue voltage that the residue amplifier amplifies for sampling and conversion by the back-end ADC stage to provide the digital measure of the offset voltage of the residue amplifier and back-end ADC stage.

11. The foreground self-calibration method of claim 8, where computing the element mismatch calibration value comprises:

measuring each single unit value DAC element being calibrated in the front-end DAC by sampling a high reference voltage Vrefh on the single unit value DAC element, and then switching the single unit value DAC element being calibrated to a low reference voltage Vrefl to create a residue voltage Vres that is amplified by the residue amplifier for sampling and conversion by the back-end ADC stage.

12. The foreground self-calibration method of claim 11, where measuring each single unit value DAC element being calibrated in the front-end DAC comprises a sampling phase comprising:

charging all top capacitor plates of the plurality of DAC elements to a common mode voltage;

charging a bottom capacitor plate of the DAC element being calibrated to a high reference voltage Vrefh;

charging all bottom capacitor plates of the plurality of DAC elements except the DAC element being calibrated to a low reference voltage Vrefl; and disconnecting all top capacitor plates of the plurality of DAC elements from the common mode voltage at the end of the sample phase.

13. The foreground self-calibration method of claim 12, where measuring each single unit value DAC element being calibrated in the front-end DAC comprises an approximation phase comprising:

charging the bottom capacitor plate of the DAC element being calibrated to the low reference voltage Vrefl; and using the back-end ADC stage to run a successive approximation measure on the amplified residue voltage generated by the residue amplifier to obtain a first approximation result for the element mismatch calibration value for the single unit DAC element being calibrated in the front-end DAC.

14. The foreground self-calibration method of claim 8, where computing the element mismatch calibration value comprises:

measuring each multi-unit value DAC element being calibrated in the front-end DAC by sampling a high reference voltage Vrefh on the multi-unit value DAC element, and then switching the multi-unit value DAC element being calibrated to a low reference voltage Vrefl to create a residue voltage Vres that is amplified by the residue amplifier for sampling and conversion by the back-end ADC stage.

15. The foreground self-calibration method of claim 14, where measuring each multi-unit value DAC element having a capacitance value of k*C being calibrated in the front-end DAC comprises a sampling phase comprising:

charging all top capacitor plates of the plurality of DAC elements to a common mode voltage;

charging a bottom capacitor plate of the multi-unit DAC element having a capacitance value of k*C to a high reference voltage Vrefh;

charging all bottom capacitor plates of the plurality of DAC elements having a capacitance value of (k−1)*C to a low reference voltage Vrefl; and disconnecting all top capacitor plates of the plurality of DAC elements from the common mode voltage at the end of the sample phase.

16. The foreground self-calibration method of claim 15, where measuring each multi-unit value DAC element being calibrated in the front-end DAC comprises an approximation phase comprising:

charging the bottom capacitor plate of the multi-unit DAC element having a capacitance value of k*C to the low reference voltage Vrefl;

charging all bottom capacitor plates of the plurality of DAC elements having a capacitance value of (k−1)*C to the high reference voltage Vrefh; and using the back-end ADC stage to run a successive approximation measure on the amplified residue voltage generated by the residue amplifier to obtain a first approximation result for the element mismatch calibration value for the multi-unit DAC element being calibrated in the front-end DAC.

17. The foreground self-calibration method of claim 8, wherein the plurality of DAC elements in the front-end DAC comprises a plurality of DAC capacitors, a termination DAC capacitor, and one or more redundant DAC capacitors.

18. A pipelined successive approximation register analog-to-digital converter (SAR ADC) comprising a front-end ADC connected over a residue amplifier to a back-end ADC:

wherein the front-end ADC comprises:

a first digital-to-analog converter (DAC) configured to receive a first input voltage signal, a high voltage reference, and a low voltage reference, and to generate therefrom a first DAC output, wherein the first DAC comprises a plurality of bits encoded with one or more first DAC capacitors, a first comparator having a first input coupled to receive the first DAC output, a second input, and a first comparator output, the first comparator configured to generate a differential comparison of the first and second inputs at the first comparator output, and a successive-approximation-register (SAR) logic and calibration control block having an input coupled to receive the first comparator output, wherein the SAR logic and calibration control block is configured to provide a first ADC conversion result representation of the analog input voltage and to generate feedback control signals to the first DAC; and wherein the back-end ADC comprises:

a second DAC configured to receive an amplified residue voltage from the residue amplifier, a high voltage reference, and a low voltage reference, and to generate therefrom a second DAC output, wherein the second DAC comprises a plurality of bits encoded with one or more second DAC capacitors, and a second comparator having a first input coupled to receive the first DAC output, a second input, and a second comparator output, the second comparator configured to generate a differential comparison of the first and second inputs at the second comparator output;

wherein the SAR logic and calibration control block is configured to provide control signals to the front-end ADC and back-end ADC to measure an offset calibration value for the residue amplifier and back-end ADC by tri-stating input terminals into the residue amplifier to create a residue voltage that the residue amplifier amplifies for sampling and conversion by the back-end ADC.

19. The pipelined SARADC of claim 18, wherein the SAR logic and calibration control block is configured to provide control signals to the front-end ADC and back-end ADC to:

measure an element mismatch calibration value for each of the one or more first DAC capacitors in the first DAC by switching a plurality of DAC capacitors in the first DAC to generate a residue voltage input to the residue amplifier that is roughly in the range of −1 to +1 least significant bit (LSB) of the front-end ADC and using the back-end ADC to measure an amplified residue voltage generated by the residue amplifier after for each selected DAC capacitor being calibrated.

20. The pipelined SARADC of claim 19, wherein the SAR logic and calibration control block is configured to:

compute one or more summed calibration values for one or more first ADC conversion results based on one or more of the measured element mismatch calibration values;

compute a gain adjustment value based on a total sum of all DAC capacitors in the front-end ADC that are used to sample the analog input voltage.

*    *    *    *    *